(12) United States Patent
Libsch et al.

(10) Patent No.: US 11,158,759 B1
(45) Date of Patent: Oct. 26, 2021

(54) CHIP CARRIER INTEGRATING POWER HARVESTING AND REGULATION DIODES AND FABRICATION THEREOF

(71) Applicant: International Business Machines Corporation, Armonk, NY (US)

(72) Inventors: Frank Robert Libsch, White Plains, NY (US); Ghavam G. Shahidi, Pound Ridge, NY (US); Cyril Cabral, Jr., Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/850,927

(22) Filed: Apr. 16, 2020

(51) Int. Cl.
| | |
|---|---|
| *H01L 33/00* | (2010.01) |
| *H01L 27/146* | (2006.01) |
| *H04B 10/40* | (2013.01) |
| *H04B 10/50* | (2013.01) |
| *H04B 10/69* | (2013.01) |
| *H05B 45/30* | (2020.01) |

(52) U.S. Cl.
CPC .... *H01L 33/0012* (2013.01); *H01L 27/14643* (2013.01); *H01L 33/0033* (2013.01); *H04B 10/40* (2013.01); *H04B 10/502* (2013.01); *H04B 10/6911* (2013.01); *H05B 45/30* (2020.01)

(58) Field of Classification Search
CPC ......... H01L 29/861–885; H01L 29/868; H01L 27/14643; H01L 27/1021; H01L 33/0012; H01L 33/0033; H01L 33/00–48; H01L 33/58–648; H01L 31/04–078; H01L 31/075–077; H04B 10/502; H04B 10/40; H04B 10/6911; H04B 10/691; H05B 45/30

See application file for complete search history.

(56) References Cited

U.S. PATENT DOCUMENTS

| | | | | |
|---|---|---|---|---|
| 4,764,682 | A | * | 8/1988 | Swartz .................. H04N 1/028 348/310 |
| 5,923,071 | A | * | 7/1999 | Saito ................... H01L 31/1804 257/458 |
| 6,017,778 | A | * | 1/2000 | Pezzani ................. H01L 21/761 438/138 |

(Continued)

FOREIGN PATENT DOCUMENTS

EP    1605518 A2    12/2005

OTHER PUBLICATIONS

Kenji Okabe et al, "High-gain on-chip antenna using a sapphire substrate for implantable wireless medical systems," Jpn. J. Appl. Phys. 53 04EL09 pp. 1-5, Mar. 2014.

(Continued)

*Primary Examiner* — Errol V Fernandes
*Assistant Examiner* — Jeremy J Joy
(74) *Attorney, Agent, or Firm* — Daniel Morris; Otterstedt, Wallace & Kammer, LLP

(57) ABSTRACT

A silicon chip carrier includes at least two of a photosensitive P-I-N diode, a non-photosensitive P-I-N diode, a photosensitive P-(metal)-N diode, a non-photosensitive P-(metal)-N diode, and a Schottky diode all integrally formed in the same layers of the chip carrier. In some embodiments, diodes formed in the chip carrier provide photovoltaic power and power regulation to a circuit mounted on the chip carrier.

10 Claims, 20 Drawing Sheets

(56) References Cited

U.S. PATENT DOCUMENTS

| | | | | |
|---|---|---|---|---|
| 6,774,448 | B1* | 8/2004 | Lindemann | H01L 27/1463 257/438 |
| 7,439,599 | B2* | 10/2008 | Gao | H01L 31/02161 257/443 |
| 7,774,448 | B2 | 8/2010 | Shah-Heydari | |
| 8,604,330 | B1* | 12/2013 | Hennessy | H01L 27/1421 136/201 |
| 8,675,704 | B2 | 3/2014 | Abeles et al. | |
| 8,772,842 | B2* | 7/2014 | Dora | H01L 29/66462 257/280 |
| 8,828,781 | B1* | 9/2014 | Roizin | H01L 31/075 438/80 |
| 8,912,615 | B2* | 12/2014 | Bui | H01L 27/1461 257/431 |
| 9,496,435 | B2 | 11/2016 | Wang et al. | |
| 9,691,954 | B2 | 6/2017 | Lee et al. | |
| 2005/0139252 | A1* | 6/2005 | Shim | H01L 31/076 136/244 |
| 2005/0167709 | A1* | 8/2005 | Augusto | H01L 27/14643 257/292 |
| 2005/0280114 | A1* | 12/2005 | Singh | H01L 29/861 257/502 |
| 2006/0108659 | A1* | 5/2006 | Yanagihara | H01L 27/0814 257/471 |
| 2006/0220078 | A1* | 10/2006 | Bui | H01L 27/1446 257/292 |
| 2007/0096257 | A1* | 5/2007 | Coolbaugh | H01L 29/868 257/565 |
| 2010/0025827 | A1* | 2/2010 | Fujii | H01L 29/868 257/656 |
| 2010/0140660 | A1* | 6/2010 | Wu | H01L 29/872 257/183 |
| 2011/0147894 | A1* | 6/2011 | Snyder | H01L 29/872 257/602 |
| 2011/0309476 | A1* | 12/2011 | Mita | H01L 27/0814 257/546 |
| 2012/0313212 | A1* | 12/2012 | Sugawara | H01L 29/872 257/471 |
| 2013/0043481 | A1* | 2/2013 | Schubert | H01L 33/382 257/76 |
| 2014/0273332 | A1 | 9/2014 | Roizin et al. | |
| 2014/0284754 | A1* | 9/2014 | Yamamoto | H01L 24/33 257/487 |
| 2015/0027513 | A1* | 1/2015 | Ring | H01L 27/1421 136/249 |
| 2016/0064475 | A1* | 3/2016 | Feilchenfeld | H01L 29/66136 257/484 |
| 2016/0079240 | A1* | 3/2016 | Sugita | H01L 29/0692 257/508 |
| 2018/0033880 | A1* | 2/2018 | Chen | H01L 29/1066 |
| 2018/0301872 | A1 | 10/2018 | Burroughs et al. | |
| 2018/0315738 | A1* | 11/2018 | Bono | H01L 27/156 |
| 2020/0194614 | A1* | 6/2020 | Pares | H01L 33/44 |
| 2020/0279844 | A1* | 9/2020 | Brogle | H03K 17/76 |
| 2021/0098449 | A1* | 4/2021 | Watanabe | H01L 29/0649 |
| 2021/0098572 | A1* | 4/2021 | Watanabe | H01L 29/92 |

OTHER PUBLICATIONS

Visvanathan et al., Development of silicon planar P-I-N photodiode, The 4th Annual Seminar of National Science Fellowship, Dec. 2004. https://pdfs.semanticscholar.org/bb9f/9f349fa4c76348717c3b8cd0bc17b749b317.pdf.

Kim et al., A millimeter-scale wireless imaging system with continuous motion detection and energy harvesting, In 2014 Symposium on VLSI Circuits Digest of Technical Papers, pp. 1-2. IEEE, Jun. 2014.

White paper based on the sensor presented in the ISSCC 2011 paper (6 pages) Chen et al., A cubic-millimeter energy-autonomous wireless intraocular pressure monitor, In 2011 IEEE International Solid-State Circuits Conference, pp. 310-312. IEEE, Feb. 2011.

Ralston et al., Defeating counterfeiters with microscopic dielets embedded in electronic components, Computer 49, No. 8, Aug. 2016, pp. 18-26.

Okabe et al., High-gain on-chip antenna using a sapphire substrate for implantable wireless medical systems, Japanese Journal of Applied Physics 53, No. 4S, Mar. 2014 04EL09 (Abstract Only).

Warneke et al., Smart dust: Communicating with a cubic-millimeter computer, Computer 34, No. 1, Jan. 2001, pp. 44-51.

Römer, The lighthouse location system for smart dust, In Proceedings of the 1st international conference on Mobile systems, applications and services, pp. 15-30, May 2003.

Deppe et al., Low-threshold vertical-cavity surface-emitting lasers based on oxide-confinement and high contrast distributed Bragg reflectors, IEEE Journal of Selected Topics in Quantum Electronics 3, No. 3, Jun. 1997, pp. 893-904.

Takeda et al., Few-fJ/bit data transmissions using directly modulated lambda-scale embedded active region photonic-crystal lasers, Nature Photonics 7, No. 7, Jul. 2013, pp. 569-575.

Crosnier et al., Hybrid indium phosphide-on-silicon nanolaser diode, Nature Photonics 11, No. 5, May 2017, pp. 297-300.

Le Minh et al., 100-Mbls NRZ visible light communications using a postequalized white LED, IEEE Photonics Technology Letters 21, No. 15, May 2009, pp. 1063-1065.

McKendry et al., Visible-light communications using a CMOS-controlled micro-light-emitting-diode array, Journal of lightwave technology 30, No. 1, Nov. 2011, pp. 61-67.

Komine et al., Adaptive detector arrays for optical communication receivers, IEEE Trans. Consum. Electron. 50, No. 1, Feb. 2004, pp. 100-107.

Jovicic et al., Visible light communication: opportunities, challenges and the path to market, IEEE Communications Magazine 51, No. 12, Dec. 2013, pp. 26-32.

Cho et al., Efficiency droop in light-emitting diodes: Challenges and countermeasures, Laser & Photonics Reviews 7, No. 3, May 2013, pp. 408-421.

Zhao et al., Analysis of internal quantum efficiency and current injection efficiency in III-nitride light-emitting diodes, Journal of Display Technology 9, No. 4, Apr. 2013, pp. 212-225.

Dupont et al., Efficient GaAs light-emitting diodes by photon recycling, Applied Physics Letters 76, No. 1, Jan. 2000, pp. 4-6.

Windisch et al., Light-emitting diodes with 31% external quantum efficiency by outcoupling of lateral waveguide modes Applied physics letters 74, No. 16, Apr. 1999, pp. 2256-2258.

Sun et al., Bright infrared quantum-dot light-emitting diodes through inter-dot spacing control, Nature nanotechnology 7, No. 6, Jun. 2012, pp. 369-373.

Li et al., Bright colloidal quantum dot light-emitting diodes enabled by efficient chlorination, Nature Photonics 12, No. 3, Mar. 2018, pp. 159-164.

Li et al., Ultra-low-power sub-photon-voltage high-efficiency light-emitting diodes, Nature Photonics 13, No. 9, Sep. 2019, pp. 588-592.

* cited by examiner

| Si Removed by RIE | Si thickness removed by RIE under Respective Diode Contact | | |
|---|---|---|---|
| | n+ | n- | p+ |
| During n+ etch | $\Delta X_{n+}$ | 0 | $\Delta X_{n+}$ |
| During p+ etch (Min) | 0 | $X_{n+}$ | $X_{n+}$ |
| (Max) | 0 | $X_{n+} + X_{n-}$ | *$(X_{n+} + X_{n-})$ |
| Total Removed (Min) (n+ and p+ etches) | $\Delta X_{n+}$ | $X_{n+}$ | *$(1+\Delta) X_{n+}$ |
| (Max) | $\Delta X_{n+}$ | $X_{n+} + X_{n-}$ | **$(1+\Delta) X_{n+} + X_{n-}$ |

*FIG. 25*

$$0 < \Delta < 1$$
and
$$*[X_{n+} + X_{n-}] < [(1 + \Delta)X_{n+}]$$
or
$$* X_{n-}(Max) < \Delta X_{n+}$$
and
$$**[X_{n+} + X_{n-} + \Delta X_{n+}] < [X_{n+} + X_{n-} + X_{p+}]$$
or
$$** X_{p+}(Min) > \Delta X_{n+}$$
Therefore
$$X_{n-} < \Delta X_{n+} < X_{p+}$$

*FIG. 26*

CHIP CARRIER INTEGRATING POWER HARVESTING AND REGULATION DIODES AND FABRICATION THEREOF

BACKGROUND

The present invention relates to the electrical, electronic, and computer arts, and more specifically, to tetherless devices.

Presently, tetherless semiconductor devices often require batteries or supercapacitors for power supply. Replacing a battery, or recharging a supercapacitor, is a labor-intensive task of field maintenance. Additionally, batteries or supercapacitors can add thickness that detracts from mechanical flexibility of a tetherless device.

SUMMARY

Principles of the invention provide techniques for a chip carrier integrating power harvesting and regulation diodes and fabrication thereof. In one aspect, an exemplary apparatus includes a silicon chip carrier; a first P-I-N diode that is integrally formed in the silicon chip carrier, wherein the first P-I-N diode includes a first anode and a first cathode that define a first P-I-N junction, the first anode and first cathode being shaped so that the first P-I-N junction is covered by wings of the first anode and by wings of the first cathode and the first P-I-N diode is not photosensitive; and a second P-I-N diode that is integrally formed in the silicon chip carrier, wherein the second P-I-N diode includes a second anode and a second cathode that define a second P-I-N junction, the second anode and second cathode being shaped so that the second P-I-N junction is uncovered and the second P-I-N diode is photosensitive.

In another aspect, a silicon chip carrier includes a p+ epi-Si layer, an intrinsic epi-Si layer directly contacting the p+ epi-Si layer, and an n+ epi-Si layer directly contacting the intrinsic epi-Si layer opposite the p+ epi-Si layer; and a first P-(metal)-N diode that is integrally formed in the p+ epi-Si, intrinsic epi-Si, and n+ epi-Si layers of the silicon chip carrier.

In another aspect, a method for making a silicon chip carrier with integrated diode circuits includes forming islands in a layered structure that includes a p+ epi-Si layer, an n- or intrinsic epi-Si layer deposited in direct electrical contact with the p+ epi-Si layer, and an n+ epi-Si layer deposited in direct electrical contact with the n- or intrinsic epi-Si layer. The method also includes growing a thermal oxide on exposed surfaces of the islands; etching a first cathode hole and a first anode hole down through the thermal oxide into the n+ epi-Si layer in a first island and etching a second cathode hole into the n+ epi-Si layer in a second island; forming cathode contacts by filling the cathode holes with a fill metal; etching the first anode hole down through the n- or intrinsic epi-Si layer to the p+ epi-Si layer in the first island and etching a second anode hole down through the thermal oxide into the n- or intrinsic epi-Si layer in the second island; and forming anode contacts by filling the first and second anode holes with the fill metal. In the first island the first cathode contact extends into the n+ epi-Si layer and the first anode contact extends into the p+ epi-Si layer, forming a P-I-N diode, while in the second island the second cathode contact extends into the n+ epi-Si layer and the second anode contact extends into the n- or intrinsic epi-Si layer, forming a Schottky diode.

In view of the foregoing, techniques of the present invention can provide substantial beneficial technical effects. For example, one or more embodiments provide one or more of:

Ability to harvest electrical power from ambient light in a flexible tetherless semiconductor device.

Ability to recharge an integrated battery without requiring field service.

Increased power generation density in a flexible tetherless semiconductor device.

Power generation and regulation integrated with processor circuitry thereby obviating assembly of separate components, minimizing package dimensions Makes it possible to now produce Schottky diodes, Zener diodes, photosensitive (unshielded) and shielded P-I-N diodes, photo-diodes in a P-N diode process without any additional fabrication steps, i.e., for the same base process (no added steps) to enable higher functionality circuits.

In addition, unique fabrication steps using only two Si etch steps to produce electrical contact to three distinct Si etch depths, aiding in three differently doped Si region contacts to P-, I, -N-regions (unique Si depth etch formula disclosed).

These and other features and advantages of the present invention will become apparent from the following detailed description of illustrative embodiments thereof, which is to be read in connection with the accompanying drawings.

BRIEF DESCRIPTION OF THE DRAWINGS

FIG. 25 depicts a table of reactive ion etch (RIE) depths during two RIE steps of preparing the silicon chip carrier of FIG. 11 through FIG. 19;

FIG. 26 depicts formulas constraining layer thicknesses of the silicon chip carrier of FIG. 11 through FIG. 19;

DETAILED DESCRIPTION

Figure 1:
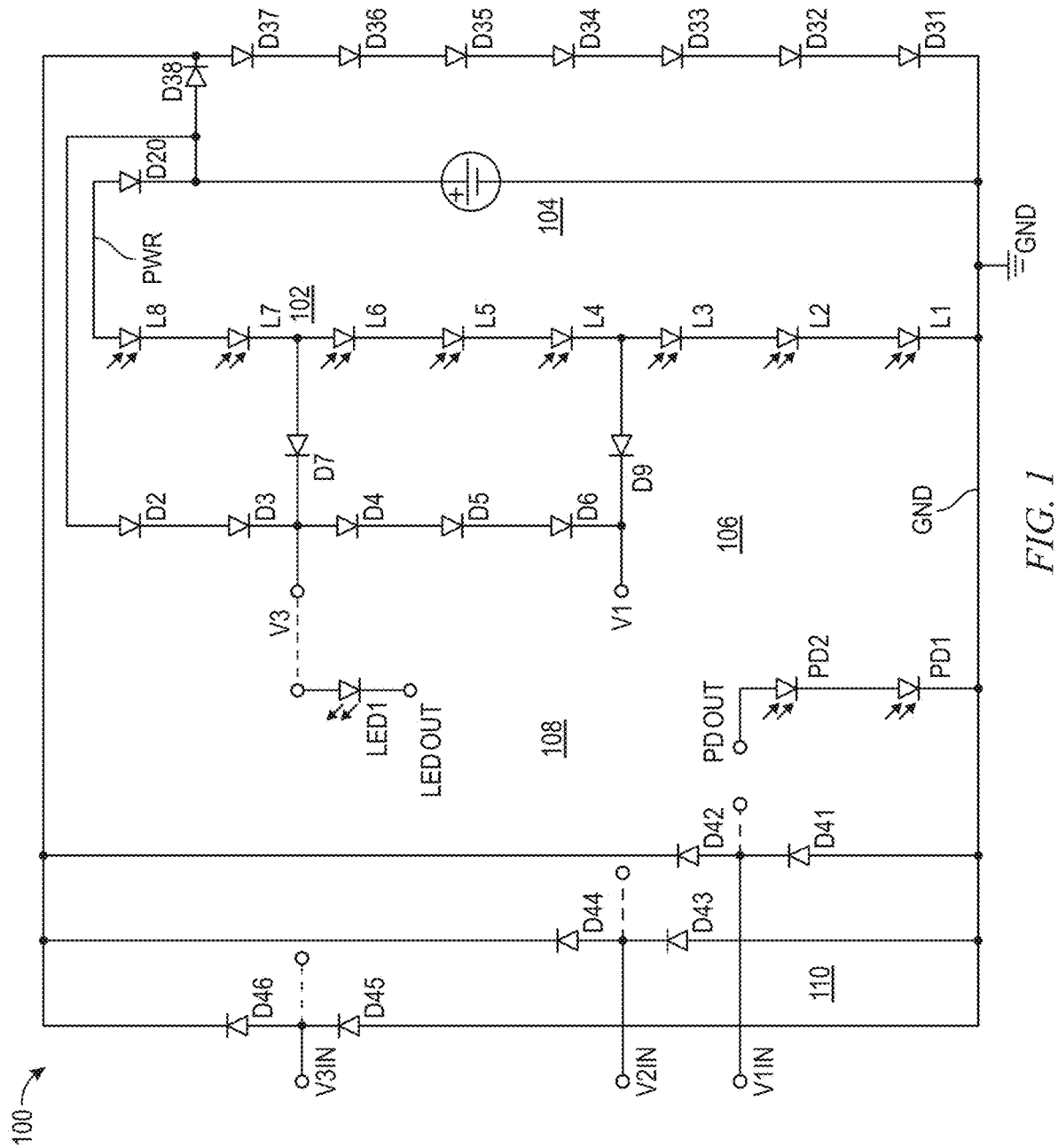
FIG. 1 through FIG. 10 depict various diode circuits according to exemplary embodiments.

Of particular emerging interest are extremely low power electronic devices that can enable new applications where these devices are far from a tethered power supply and in cases, not afford the larger footprint or the field serviceability of batteries. These applications range from sensors and smart sensors in the field to IoT devices, etc. Flexibility is a desirable trait for devices that might be embedded into otherwise flexible structures (e.g., currency).

Exemplary embodiments of the invention relate to (1) solid state device structures (2) fabrication methods, and (3) circuits of diodes. These structures, methods, and circuits are usable in functions such as (1) communication (photodiode), (2) power harvesting (photo-voltaic), (3) voltage regulation, and (4) energy storage. More specifically, embodiments of the invention realize a low cost fabrication process that minimizes photolithography steps and simultaneously produces at least three distinct diode structures that accomplish the above four circuit functions. One benefit is that these diode structures and diode circuitry do not add any additional fabrication processing beyond what is already required of the photodiode. Another benefit is that this diode structure process produces diode contacts that are planar and allow industry standard c4 flip chip bonding. Still another benefit is the resulting higher silicon carrier functionality; embodiments of the invention enable optical communication, power harvesting, regulation and storage capability for previously passive carriers, while eliminating any need for a more expensive transistor build process as in prior art active carriers. Note that in one or more embodiments, the diode circuitry accounts for all required inputs/outputs (I/Os) in a tetherless manner. The resulting silicon carrier with optical power harvesting, regulation and storage functionality in turn enables the smart chip, sensors, internet of things (IoT), etc. on the carrier in applications ranging from authenticity verification of physical mobile assets (such as with bank notes, transportation and other entertainment tickets, etc.) to tracking, to service automation value such as reading entertainment tickets, train tickets, and passports, to sensing "in the field." Other advantages of this integrated diode carrier process are:

Thin package profile, perfect for minimization of package enabling embeddedness into thin materials, such as paper, documents, banknotes, etc.

Can accommodate round and other shapes for increased in-field ruggedness and mechanical robustness.

In some embodiments, no battery, no shelf life, or associated in field battery serviceability costs, can harvest power from optical sources (scanner, room lights, sun light, etc.). By default, the circuit functions as only providing energy via photovoltaics. Each of the circuit embodiments is composed of 4 functional sections, namely optical communication, power harvesting, regulation, and storage capability. Each of the four functional sections are show, for example, in FIG. 1 as 110, 108, 106, and 104, with 104 being the energy storage section showing a battery. In one or more embodiments, energy storage section 104 can be left out.

Note that the remaining three functional sections function as intended with the minimum alteration of the battery removed. This is a very modular design. In addition to removing the battery, there are associated diodes that may be removed without affecting the remaining three functional sections, but for simplicity, it is possible to just remove the battery.

When combined with rechargeable batteries, eliminates field serviceability time and cost, as well as providing a higher power density and accommodates more complex computations and/or data sending or receiving.

Reduces testing cost with method that accommodates easy testing interfacing, less constraining larger dimensions, after assembly via near vicinity optical interrogation with no needed exact physical contacting probing in three dimensions.

Reduces bond and assembly cost of fewer components via carrier integrated power harvesting, regulation, and storage.

Further reduces assembly cost by enabling standard, high volume/main stream flip-chip bonding on the carrier.

The integrated carrier allows for minimizing the package dimensions and minimized material cost which are proportional to size.

Advantageously, devices according to exemplary embodiments of the invention are not tethered to conventional power supplies since they are able to harvest their power from the available surrounding environment.

Another advantage is that such devices are able to recharge their own batteries without incurring costly and time consuming field service.

Another advantage is that such devices can support larger and more capable processor and/or memory for performing more sophisticated calculations or for handling larger data manipulation.

Another advantage is that such devices meet the low costs of manufacturing and service required to become ubiquitous in some markets, such as tracking or monitoring lower physical cost items. These new markets would include monitoring safety, providence, authenticity detection, and/or inventory management of food items, pharmacy, etc. The lower cost for these smaller electronic devices includes all the cost, i.e. not only the material costs of the electronic devices, but also the bond, assembly, packaging and testing.

In general, the smaller the footprint (less circuitry, small processor, smaller memory), the lower the material cost, but the higher the assembly and packaging cost. Conventionally, the assembly time throughput decreases and the packaging cost increases with smaller devices, due to the higher placement accuracy and resolution of the bonding and packaging assembly and tooling needed, which is a departure from the mainstream, higher volume tooling. However, according to exemplary embodiments of the invention, the bond, testing, assembly, and packaging cost are minimized. For example, material cost is reduced by reducing device size (including packaging), bond and assembly costs are reduced by forming diode structures integral to the chip carrier rather than separately assembled onto the carrier, and testing cost is reduced by using already existing optical communication diodes bonded to the carrier to allow near vicinity optical interrogation/testing. Optical interrogation eliminates the conventional and costly small probes, the corresponding probe pads, and the time consuming exact three-dimensional alignment to physically contact the probes onto the probe pads of the circuit on the carrier to be tested. It is worth noting that LED compounds are typically incompatible with silicon (or diode) processing, and actually, may contaminate the Silicon devices/fab. If needed, in one or more embodiment, LEDs can either be bonded (after step 2650 in FIG. 28) to metal pads (step 2650) as well as any other chip.

Advantageously, embodiments of the invention provide energy harvesting, voltage regulation, and energy storage that are low cost and integrated without requiring added bond and assembly costs.

According to exemplary embodiments, a simple and low cost method is provided for implementing the above conditions when photovoltaics (PVs) are being used. This can be done by using a few diodes that are easily integrated with the PV cells into the silicon carrier package without additional fabrication effort. These diodes provide a circuit function of at least one of the following:

(1.) Optical power harvesting,
(2.) rectification for energy storage,
(3.) voltage regulation,
(4.) optical communication, and
(5.) electrostatic discharge (ESD) protection.

Optical power harvesting can encompass photovoltaics absorbing photons to excite valence electrons, which jump the bandgap of the photovoltaic semiconductor to produce a voltage and a current.

Rectification and voltage regulation can encompass evening out fluctuations of voltage and current that might arise from fluctuating light intensity on a photovoltaic device.

Energy storage can encompass using batteries, capacitors, supercapacitors, or other charge storage devices.

Optical communication can encompass photodiodes for receiving incoming optical communication, laser diodes or light emitting diodes for outgoing optical communication, or other optical communication diodes.

ESD protection can encompass using back-to-back diodes, diode pairs, etc. for any inputs/outputs of the Si Carrier Package.

FIGS. 1 through 10 depict in electrical schematics various diode circuits that implement the above-mentioned functions. FIG. 1 depicts an exemplary circuit 100 to be implemented in a silicon carrier. FIG. 2 through FIG. 10 depict variations 200, 300, 400, 500, 600, 700, 800, 900, 1000 of the exemplary circuit 100. Each variation includes many components similar to those of the exemplary circuit 100. Similar components are marked by identical reference characters throughout the drawing figures.

Diode Circuit Function: (1.) Optical Power Harvesting

Referring specifically to FIG. 1, the exemplary circuit 100 includes a power rail PWR and a ground rail GND. The circuit 100 also includes a PV cell array or energy harvesting circuit 102 (L1, L2, L3, L4, L5, L6, L7, L8) and an energy storage device 104 (diode D20 and battery BT5), which are connected between the power rail PWR and the ground rail GND. The PV cell array provides high voltage to the power rail. In one or more embodiments, there is no external power supply. Thus, the label "PWR" in FIGS. 1-10 represents the "high voltage" generated on the substrate by the photovoltaic diodes during optical energy harvesting. The PV cell array 102 has an open circuit voltage that matches the charging voltage of the battery BT5 plus the forward voltage of the diode D20 (i.e. the charging voltage of the energy storage device 104). That is, the PV cell array 102 wisely includes some additional voltage margin to account for variations in environmental light intensity, fabrication processing, etc. For example, for a 4.2V battery BT5, choose a PV cell array with 4.8V drop or higher to optimize both the parameters.

The above conditions could be difficult to achieve because PV cells are subjected to environmentally varying illumination levels and illumination angles, such as from varying sun ray positions and/or optical scanner position(s).

In some IoT instances, a well-controlled optical scanner interrogates the PV cell array, with the optical scanner having a fixed illumination power and angle of incidence. It is understood that the energy harvesting circuit diode arrangements and numbers can be optimized differently for each use case.

As discussed above, in order to avoid unnecessary loading of the PV cells it is desirable to have conditions ideally matching the PV voltage with the battery technology and battery voltage.

Silicon PV cells have an open circuit voltage of ~0.6V (ranging from 0.5V to 0.7V depending on semiconductor doping and fabrication) and are easily integrated into the silicon carrier package, thus minimizing cost. There are additional options for PV cells that can be fabricated in various other carriers, such as AlGaAs PV cells on Offcut Si, GaAs PV cells on GaAs, AlGaAs PV cells on Silicon-on-Insulator (SOI), Si PV cells on SOI, etc. These non-silicon PV cells have a different bandgap than silicon, and will exhibit a different open circuit voltage. For example, GaAs and AlGaAs PV cells can exhibit an open circuit voltage of ~1.2V and ~1.45V, respectively, per cell. The enclosed embodiments teach various energy harvesting circuits assuming Si PV cells, but it is understood by those skilled in the art that non-silicon PV cells can be substituted by taking into account the different open circuit voltage.

Figure 7:
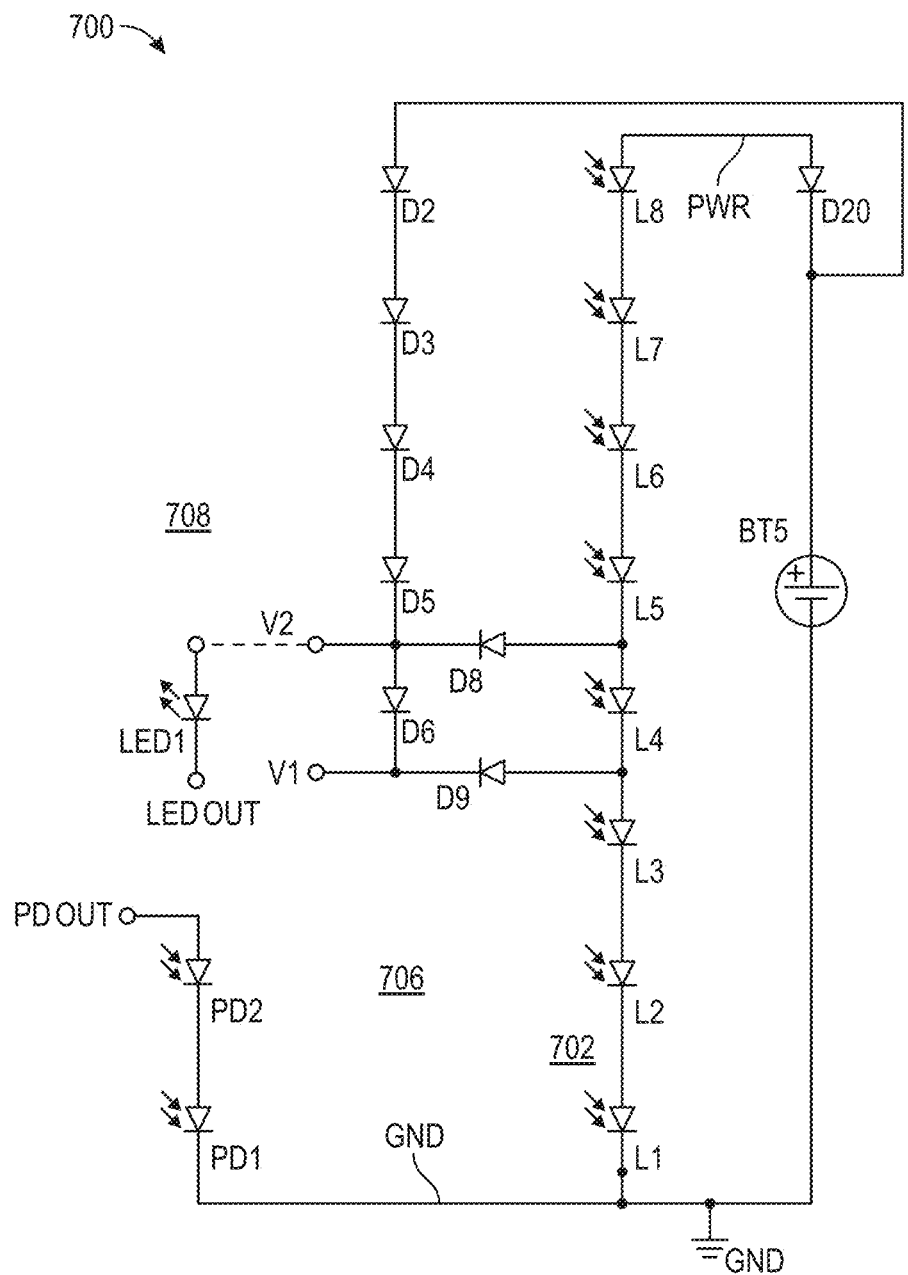

Similar to FIG. 1, FIG. 7 depicts a photovoltaic energy harvesting circuit 702 that includes photovoltaic cells L1, L2, L3, L4, L5, L6, L7, L8.

Diode Circuit Function: (2.) Rectification for Energy Storage

Still referring to FIG. 1, the exemplary circuit 100 also includes as part of the energy storage device 104 a rectifying diode D20 that is designed to take into account the maximum current value that can be supplied by the PV cells connected in series (L1 through L8). For example, the maximum current of a photovoltaic cell (L1 through L8) depends upon the size or surface area of the cell's P-N-junction, the amount of light hitting the cell, its efficiency of converting this light into a current, and of course the type of semiconductor material that the cell is fabricated from, e.g., silicon, gallium arsenide, cadmium sulphide, or cadmium telluride.

Figure 2:
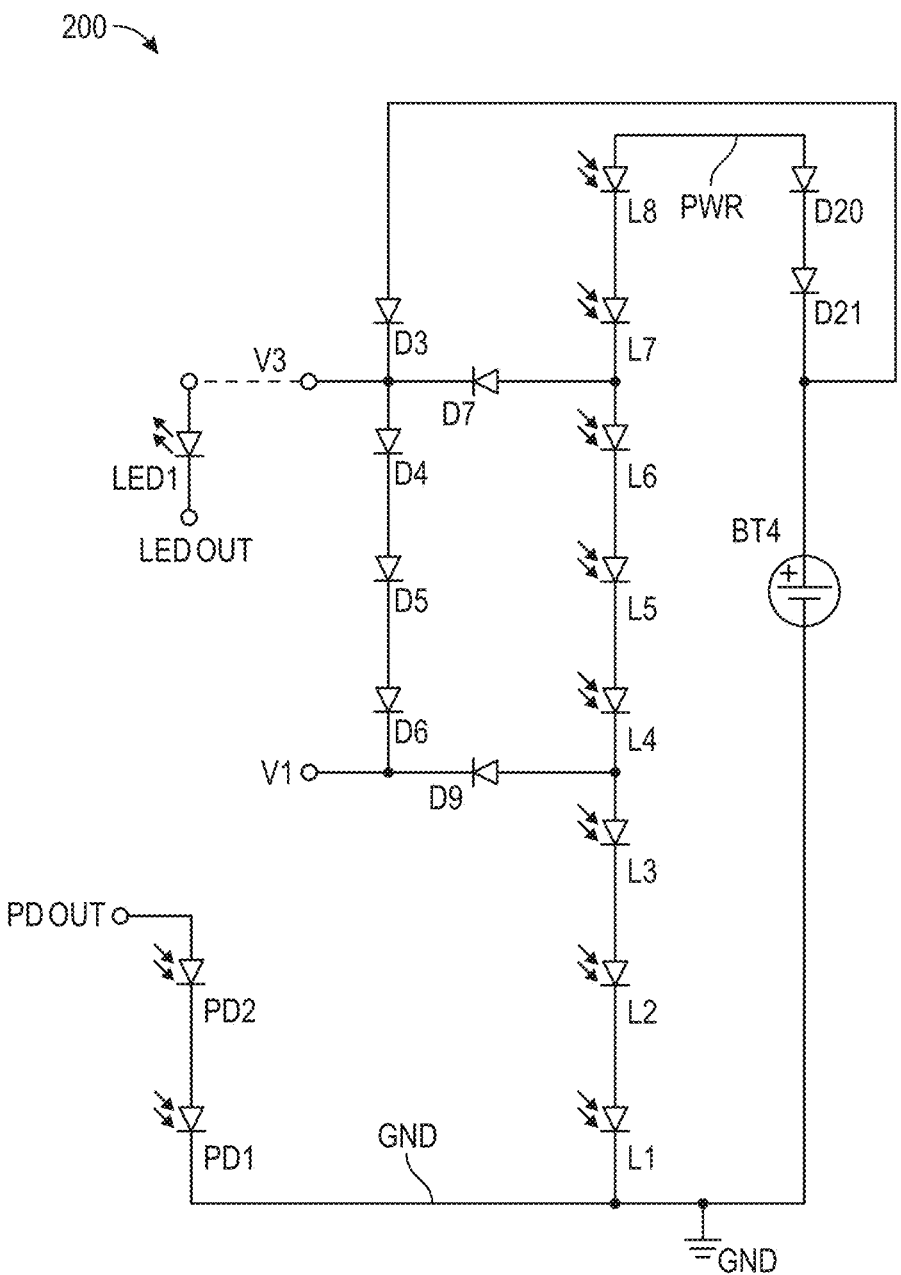
Figure 3:
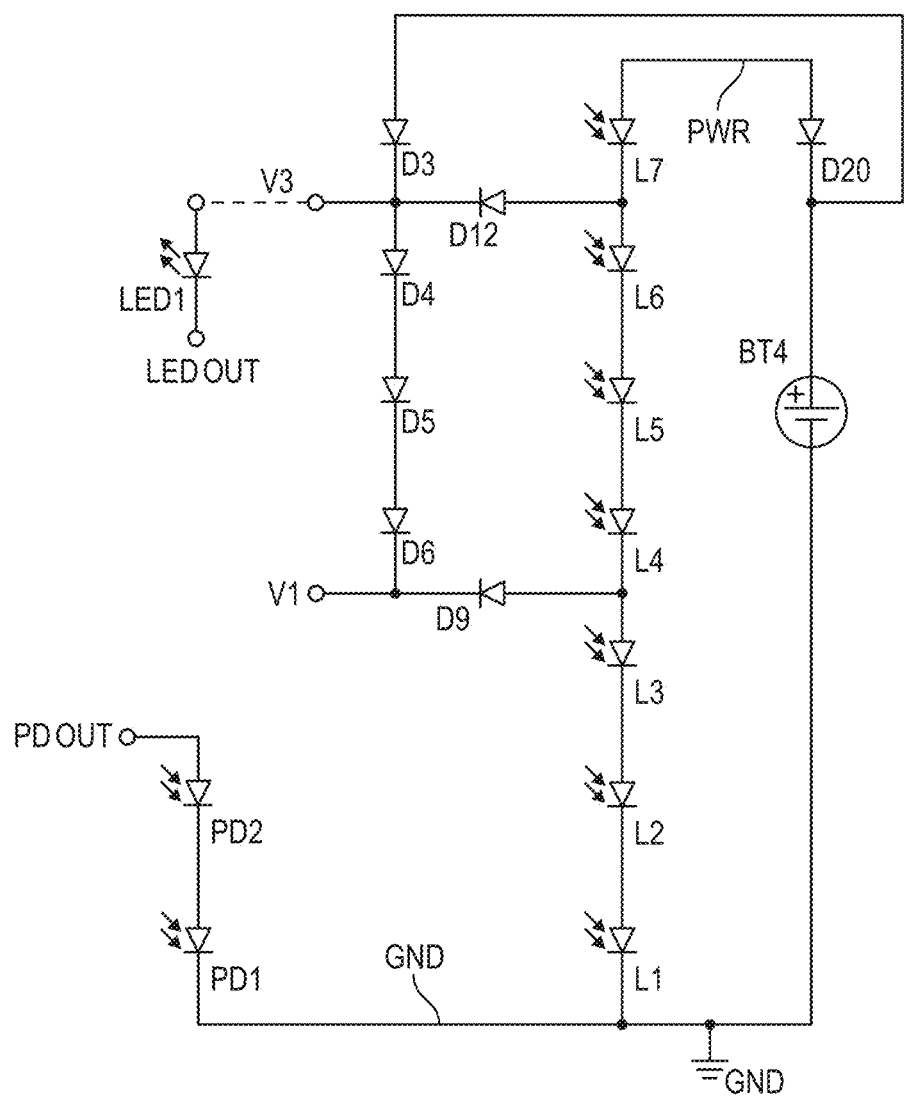

Referring, for example, to FIGS. 1 through 10, PV cells connected in series (L1, L2, L3, L4, L5, L6, L7, L8 in FIG. 1, FIG. 2, FIG. 7, FIG. 10; L1, L2, L3, L4, L5, L6, L7 in FIG. 3, FIG. 4, FIG. 5, FIG. 8, FIG. 9; L1, L2, L3, L4, L5 in FIG. 6) have an additive open circuit voltage across them that is at least greater than the maximum charging voltage of the battery (BT5 in FIG. 1, FIG. 7, or FIG. 10; BT4 in FIG. 2, FIG. 3, or FIG. 8) or battery stack (BT1, BT2, BT3 in FIG. 4, FIG. 5, or FIG. 9; just BT1 and BT2 in FIG. 6). A silicon-based rectifier such as D20 (FIGS. 1 through 10) has a forward voltage drop of ~0.6 volts, so by adding diodes in series it is possible to isolate the PV cells (e.g., L1 through L8 in FIG. 1) from getting dragged to the voltage of the connected battery (e.g., BT5 in FIG. 1). In general, the isolation function between the PV cells and the battery(ies) is represented by a single rectifying diode, D20. It is also understood that the number of additional rectifier diodes in series can be added and would in general be matched by an additional number of PV cells added for a given battery, with the goal of keeping the maximum allowed voltage charging differential across the battery(ies) and also preventing the PV cells from being loaded down to the connected battery voltage. For example, FIG. 3 shows seven PV cells (L1 through L7) that produce an approximate open circuit voltage of 4.2V, connected to one isolating rectifier diode, D20, with forward drop ~0.6V to match the battery BT4 charging voltage of ~3.6V. If an additional rectifier diode, D21, is added in series with D20, as shown in FIG. 2, at least one additional PV cell, L8, is added. L8 should have similar open circuit voltage matching D21's forward voltage drop of ~0.6V. The desired result is that a battery BT4 charging voltage of ~3.6V remains unchanged.

If a battery BT4 of charging voltage of 3.6V (FIG. 2) replaces the existing BT5 battery or charging voltage of 4.2V (FIG. 1), then a second rectifier diode, D21, in series with D20 would be optimal to keep the same battery voltage differential. The intent here is to provide the maximum allowed charging voltage to the battery, produced by the maximum voltage (open circuit voltage) across the PV cells connected in series (L1 through L8). The maximum voltage across the PV cells in turn is proportional to the maximum illumination level that the PV cells are subjected to. In a similar manner, if an additional (ninth) PV cell (not shown) were added in series to the existing L1 through L8 PV cells of FIG. 2, then an additional isolating rectifying diode of 0.6V drop (not shown) would be added in series to the existing D20 and D21 diodes.

Note that the rectifying diodes (D20, D21, etc.) ensure that the electrical current only flows in one direction "OUT" of the series PV array to the external load, optical communication devices, batteries, etc. Thus, the rectifying diodes (D20, D21, etc.) connected above the battery not only maintain the PV output voltage above the maximum battery voltage, but also isolate the batteries from the PV cells so that when there is no or insufficient illumination the PV cells will not drain the batteries.

Figure 22:
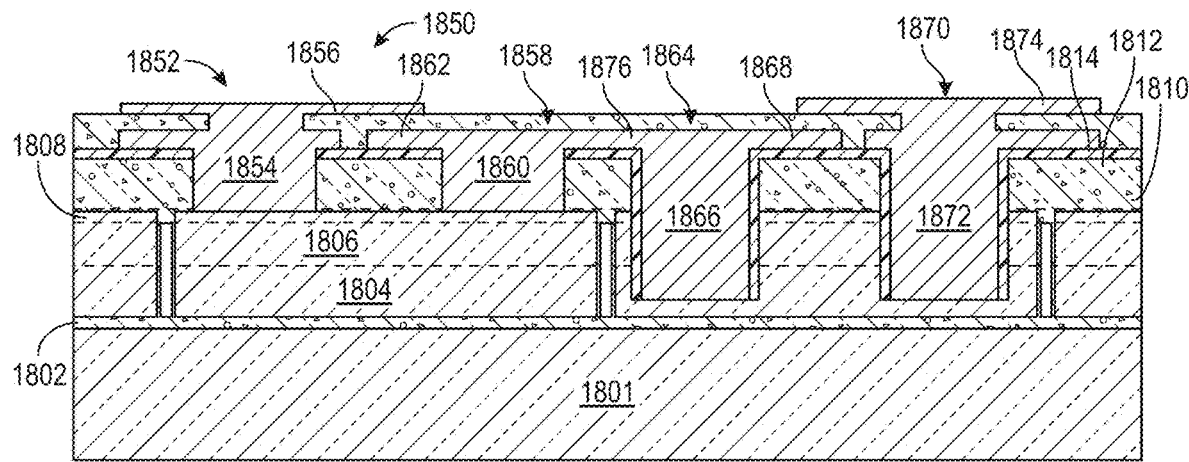
FIG. 22 depicts a side sectional view of a silicon chip carrier with an integrated photosensitive (unshielded) P-I-N diode, according to an exemplary embodiment.
Figure 23:
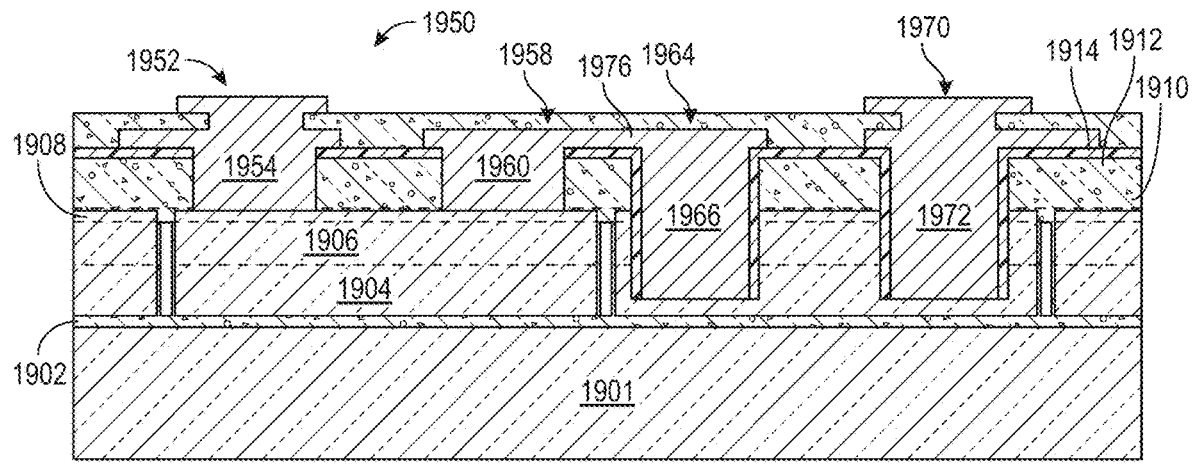
FIG. 23 depicts a side sectional view of a silicon chip carrier with an integrated photosensitive (unshielded) P-(metal)-N diode, according to an exemplary embodiment.

At least three types of diodes can be employed as the rectifying diodes (D20, D21, etc.): P-N- or P-I-N-junction diodes and Schottky barrier diodes. All can be fabricated on the silicon carrier with a wide range of current ratings. The Schottky diode has a much lower forward voltage drop of approximately 0.35V as opposed to ~0.6V for the P-N or P-I-N diodes. In general, a lower voltage drop allows power savings, since less power is dissipated in the lower voltage Schottky rectifying diode(s). FIGS. 22 and 23 depict P-N diodes according to an exemplary embodiment; these actually are P-(metal)-N diodes that use two "islands" of semiconductor and a cathode-to-anode via to short across the intrinsic layers of adjacent P-I-N stacks, as will be further discussed below.

Similar to FIG. 1, FIG. 7 depicts an energy storage circuit that includes battery BT5 and rectifying diode D20.

Diode Circuit Function: (3.) Regulation

Referring to FIG. 1, the exemplary circuit 100 includes a voltage regulation device 106 that comprises diode string D2, D3, D4, D5, D6 and diodes D7 and D9. The node between L3, L4 is at 1.8V above GND in normal operation, while the output of D20 is at 4.2V above GND, i.e. the voltage of the battery BT5. Diode D9 is connected from the L3, L4 node to the low side of diode D6, providing a drop of ~0.6V to D6 from the nominal operating voltage of 1.8V at L3, L4. Power output terminal V1 is connected between D6 and D9 for a regulated level of 1.2V above GND. Diode D7 is connected from the L6, L7 node to the D3, D4 node providing a drop of ~0.6V to D3, D4 from the L6, L7 nominal operating voltage of 3.6V above GND. Power output terminal V3 is connected to the D3, D4 node for a regulated level of 3.0V above GND.

Figure 4:
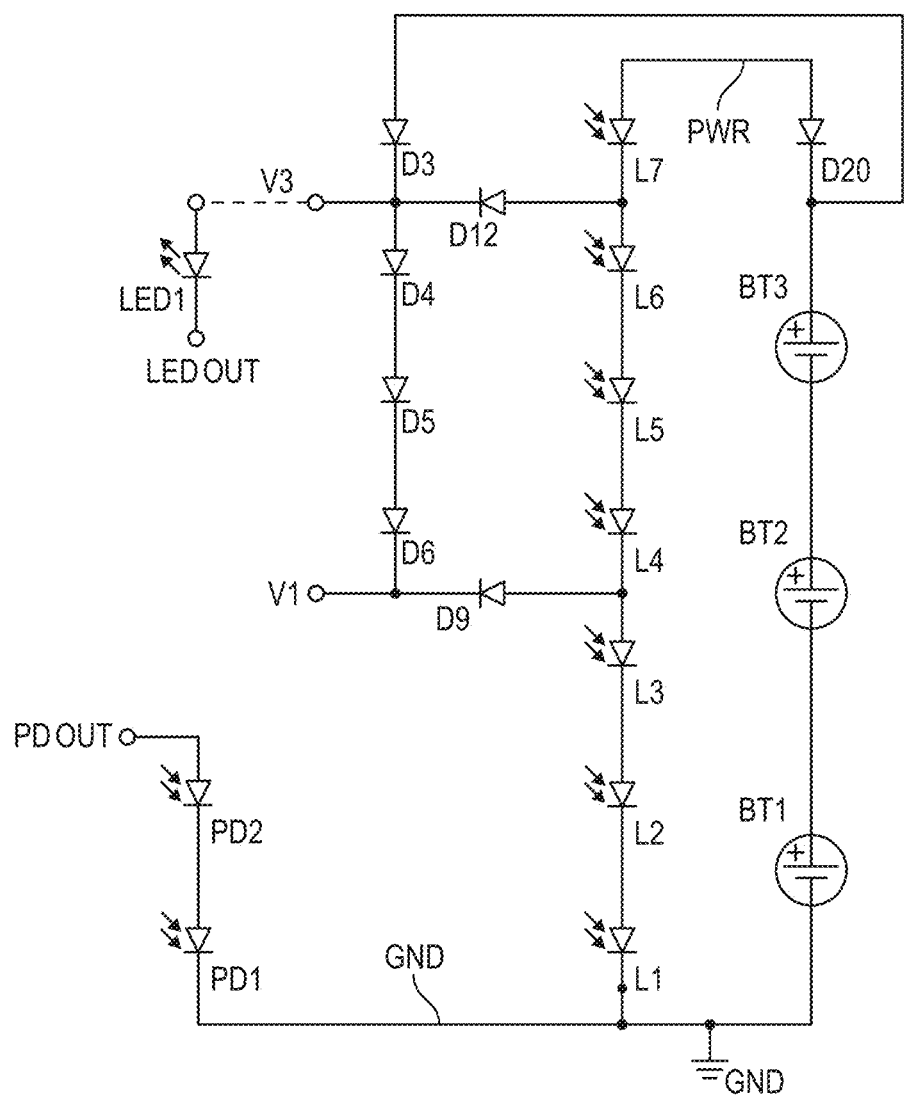
Figure 5:
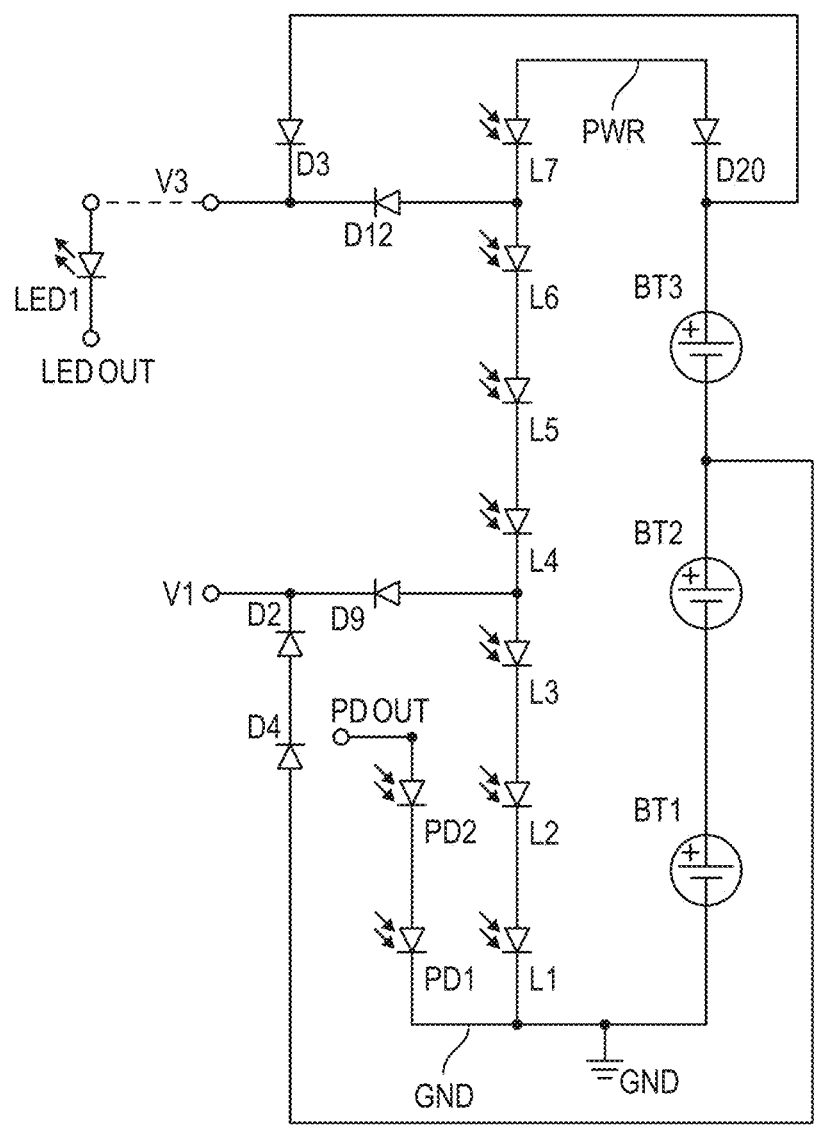
Figure 6:
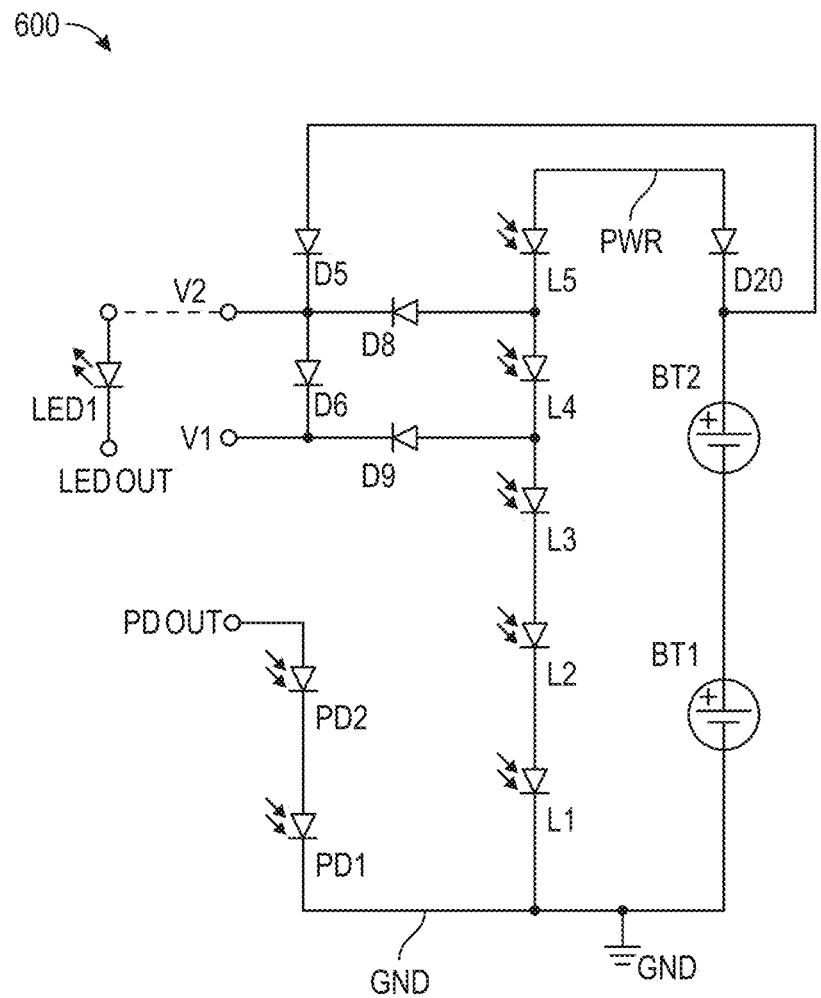
Figure 8:
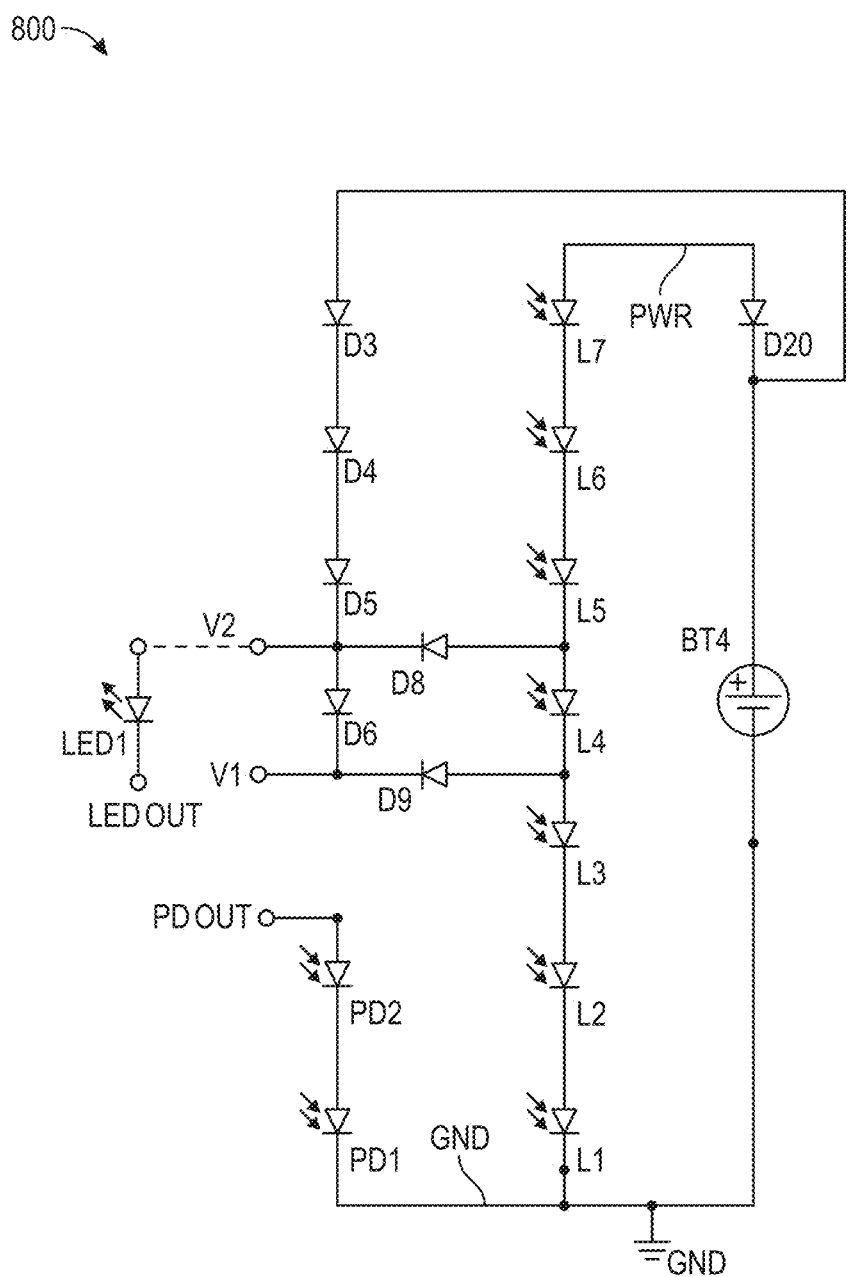
Figure 9:
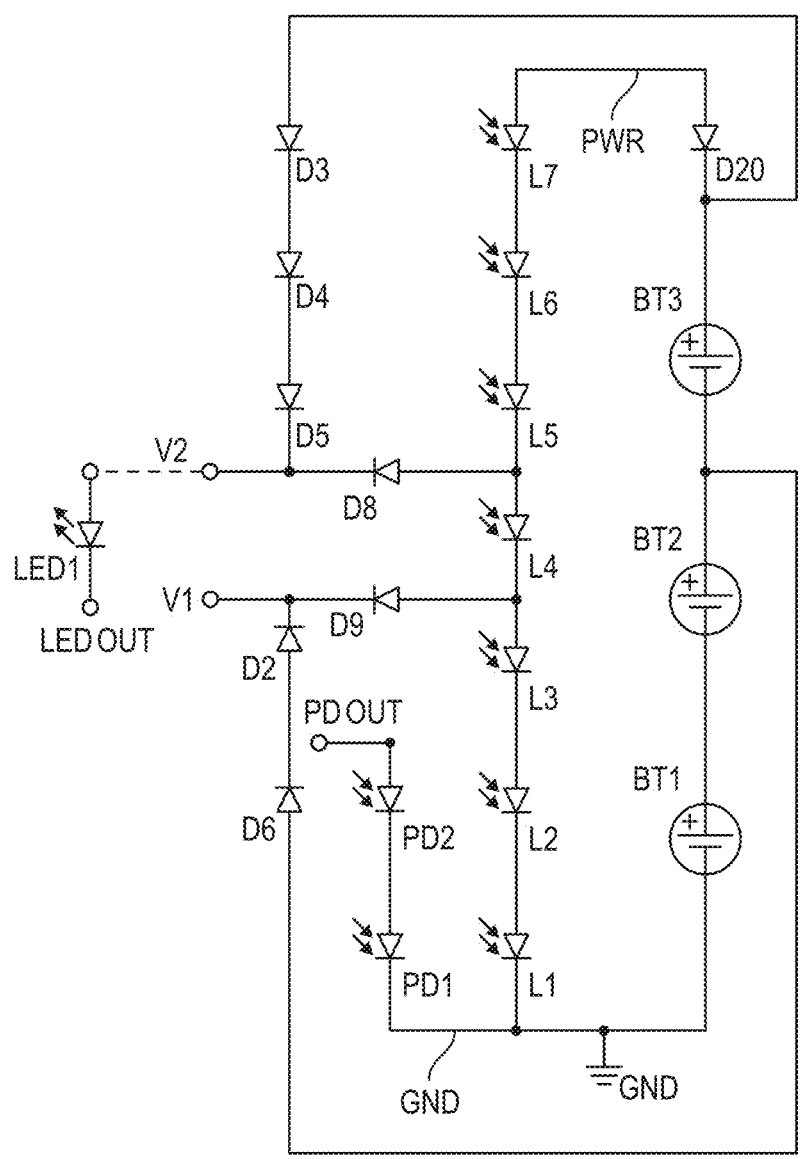
Figure 10:
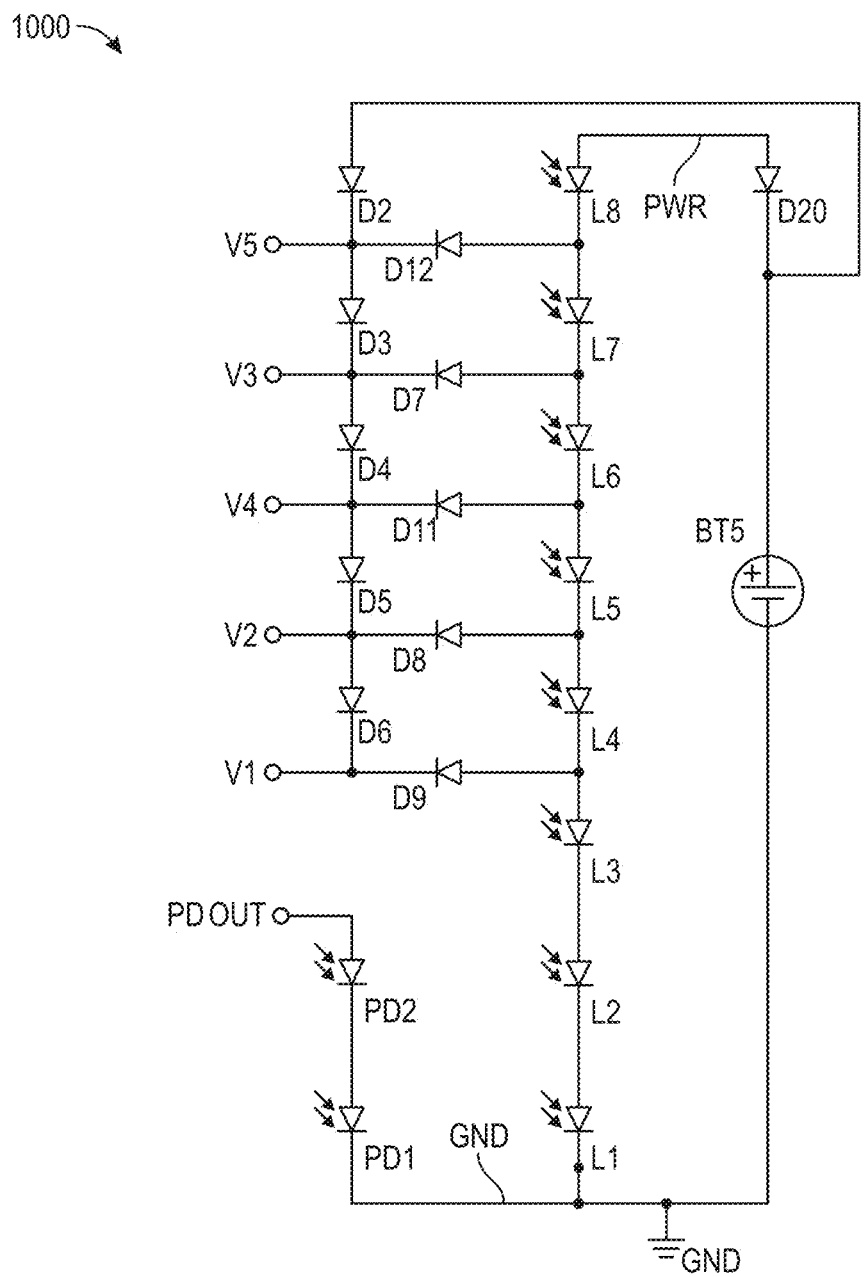

FIG. 2 depicts diodes D3, D4, D5, D6, D7, D9 arranged to provide 1.2V above GND at V1 and 3.0V at V3. FIG. 3 and FIG. 4 depict D3, D4, D5, D6, D9, and D12 arranged to provide 1.2V at V1 and 3.0V at V3. The embodiments in FIG. 2 and FIG. 3 either have an extra photovoltaic diode L8 and regulation diode D21 or do not, respectively, but use the same battery charging of 3.6V or 1.2V and 3.0V output supply, respectively. FIG. 5 depicts D2, D4, and D9 arranged to provide 1.2V at V1 and D3 and D12 arranged to provide 3.0V at V3. FIG. 6 depicts D5, D6, D8, D9 arranged to provide 1.2V above GND at V1 and 1.8V at V2. FIG. 7 depicts the same string of diodes D2 through D6 as in FIG. 1, but instead of diode D7 connected from L6, L7 to D3, D4, diode D8 is connected from L4, L5 to D5, D6 thereby providing 1.8V above GND at power output terminal V2. FIG. 8 depicts D3 through D6, D8 and D9 arranged to provide 1.2V at V1 and 1.8V at V2. FIG. 9 depicts D2 through D6 connected with D8 and D9 to provide 1.2V at V1 and 1.8V at V2. FIG. 10 depicts D2 through D9, D11 and D12 arranged to provide output voltages of 1.2V at V1, 1.8V at V2, 3.0V at V3, 2.4V at V4, and 3.6V at V5.

Similar to FIG. 1, FIG. 7 depicts a voltage regulation circuit 706 that includes diodes D2, D3, D4, D5, D6, D8, D9 with power output terminals V1 and V2.

Diode Circuit Function: (4.) Optical Communication.

FIG. 1 depicts as part of the exemplary circuit 100 an optical communications device 108, which comprises LED1, a light emitting diode and PD1, PD2, which are photodiodes. FIG. 2 through FIG. 9 also show LED1. FIG. 2 through FIG. 10 show PD1, PD2. Similar to FIG. 1, FIG. 7 depicts an optical communications device 708 that comprises LED1, PD1, and PD2.

Optical communication hardware implements, for example, two functions: (1) the transmitting of data, and (2) the receiving of data. Both of these functions can be accomplished by diodes such as the light emitting diode LED1 for transmitting of data and the photodiodes PD1, PD2 for receiving of data. By mixing together a variety of semiconductor, metal and gas compounds, the following list of LEDs, for example, can be produced:

Gallium Arsenide (GaAs)—infra-red
Gallium Arsenide Phosphide (GaAsP)—red to infra-red, orange
Aluminum Gallium Arsenide Phosphide (AlGaAsP)—high-brightness red, orange-red, orange, and yellow
Gallium Phosphide (GaP)—red, yellow and green
Aluminum Gallium Phosphide (AlGaP)—green
Gallium Nitride (GaN)—green, emerald green
Gallium Indium Nitride (GaInN)—near ultraviolet, bluish-green and blue
Silicon Carbide (SiC)—blue as a substrate
Zinc Selenide (ZnSe)—blue
Aluminum Gallium Nitride (AlGaN)—ultraviolet Most common LEDs require a forward operating voltage of between approximately 1.2 to 3.6 volts and emission is dependent on the semiconductor bandgap properties. For example, conduction begins and light is produced at approximately 1.2V for a standard red LED, approximately 2.5V for a blue LED. It is understood in the art that in the disclosed circuit diagrams (FIG. 1 through FIG. 10), voltages for LEDout and PDout are with reference to GND and typically require being pulled low to 0V and being pulled high to ~1.2V, respectively, to turn on. The 1.2V is an upper voltage found in typical scaled CMOS fabrication nodes. It is understood by those skilled in the art that the required voltage drop across the LED and the photodiode are what determine the device on and off state and that the voltages for LEDout and PDout are adjusted accordingly.

In a similar manner as LEDs, photodiodes (PDs) may be made of a variety of semiconductor compounds, for example, Si, GaAsIn, GaAs, CdS, CdTe, and the like.

Note that some silicon semiconductors/semiconductor compounds may be fabricated with the carrier such as silicon PDs for a silicon carrier package, and other non-silicon LEDs/PDs are fabricated separately such as GaN LEDs and can then be attached by techniques such as flip chip C4 to the silicon carrier. Once the photodiodes are fabricated and the LEDs bonded to the substrate, testing via optical interrogation can commence. The photodiodes will provide the optical testing pattern downlink to the substrate circuits to be tested, with the LEDs providing the uplink to the external optical reader interpreting the response of the testing pattern. In one or more embodiments, substrate circuit power is supplied by on substrate energy harvesting activated by the incoming optical testing pattern, eliminating any power supply probes. Thus, no electrical probes or testing probe pads are needed (eliminating this cost).

Diode Circuit Function: (5.) ESD Protection.

ESD protection methods require the placement of adequate on-chip protection devices in the Input/Output connections as well as in the power supply rail to absorb ESD energy. The idea of the protection scheme is to limit the voltage and then have a robust path for the ESD currents which flow between any pair of pins. In general, Input/Output connections are shunted to the ground rail under ESD overvoltage. Also, in general, output connections are usually protected at the Inputs of the attached chip and are not shown here for clarity.

For effective whole substrate ESD protection, FIG. 1 shows an ESD protective circuit 110 that not only has the Input/Output connections V1in, V2in, V3in protected (shunted) by diodes D41, D42; D43, D44; and D45, D46, but also clamps the power rails by diodes D31, D32, D33, D34, D35, D36, D37, D38 so that ESD current can be discharged and discharge through internal circuits avoided when a trigger voltage is exceeded. The trigger voltage is generally set higher than the maximum supply voltage to minimize ESD protection current during normal operation. The selection of what type of clamp to employ in a design is based on several criteria. The first criterion is what circuit elements are available in the given process. An exemplary less complex silicon carrier process is a low cost, minimum step process that produces only diodes. Other circuit devices can be added, but at the expense of more complicated processing steps and resulting higher cost.

Fortunately, the p-n diode and diode string in the Si carrier process is robust (compared to scaled thin oxide MOSFETS), and can be utilized. As an illustration, FIG. 1 shows inputs V1in, V2in, and V3in having overvoltage protection via P-N diodes D42, D44 and D46, and undervoltage (negative) protection via diodes D41, D43 and D45, respectively, for any Input connections needed. These diodes will turn on and limit any ESD voltage to one diode voltage drop above the power rail (~4.2V) and one diode voltage drop below GND (~-0.6V), and shunt the ESD current through the diode string D31 through D37 that is clamped across the power rail (battery).

For those skilled in the art, it is understood that one (as shown) or more diodes can be added in series for the overvoltage and undervoltage protection at any Input/Output connection to raise the overvoltage or undervoltage protection limit. Also, other diodes, such as Schottky diodes, can be substituted for the P-N diodes with the advantage of having a lower forward voltage drop (~0.3-0.6V). In a similar manner, to lower the value of overvoltage protection limit of inputs V1in, V2in, and V3in below ~4.2V, diodes D42, D44 and D46 should be disconnected from the node between D36 and D37 and re-connected to a node between diodes D31 and D36. For example, re-connecting diodes D42, D44 and D46 to the node between diode D35 and D36, or between diodes D34 and D35, lowers the overprotection limit by that number of diode voltage drops slipped, or to an overprotection limit of ~3.6V, or ~3.0V, respectively.

The clamping of the power rail via a static clamp, or steady-state current and voltage response, is accomplished by the diode string D31, D32, D33, D34, D35, D36, D37. A fixed voltage level activates the static clamps: a voltage above the diode string on voltage will conduct current and limit any further voltage rise. The number of diode voltage drops in forward bias will dictate the upper voltage limit. For example, the diode string clamp D31 through D36 will shunt current to GND when V1in, V2in, and/or V3in voltage exceeds 4.2V, assuming a P-N diode turn on voltage of 0.6V. Overvoltage protect diode D37 connects in series to the diode string clamp D31 through D36 that provides a maximum voltage of 4.2V across the battery supply while allowing no ESD current shunting through the battery. In FIG. 1, the 4.2V static clamp is intended to protect the 3.6V Li-ion battery, which can tolerate an upper charging voltage of approximately 4.2V. For those skilled in the art, a Zener diode substitution of the diode string clamp D31 through D36, with a Zener breakdown voltage of 3.6V, is possible, and will provide more ESD current independent turn-on shunt voltage in a smaller area, but at the expense of additional processing on top of the basic P-N diode process.

For those skilled in the art, given the teachings herein, a transient clamp is also an option.

As mentioned above, any of the diode circuits of FIG. 1 through FIG. 10 can be implemented in a silicon carrier according to an exemplary method of manufacture as depicted in FIG. 11 through FIG. 19. The exemplary method of manufacture advantageously results in the diodes of the circuits being integrally formed in the silicon chip carrier. By contrast, diode circuits typically are built onto a chip carrier diode-by-diode. Historically, to keep cost low, chip carriers have been passive (no active devices) with fewer processing steps. For a small percentage of chip carriers that needed to supply optical power, photosensitive silicon diodes had been used while other diodes, such as Schottky diodes, or shield and unshielded diodes, required additional processing steps and/or yield detractors and were often deemed too costly to justify.

Figure 11:
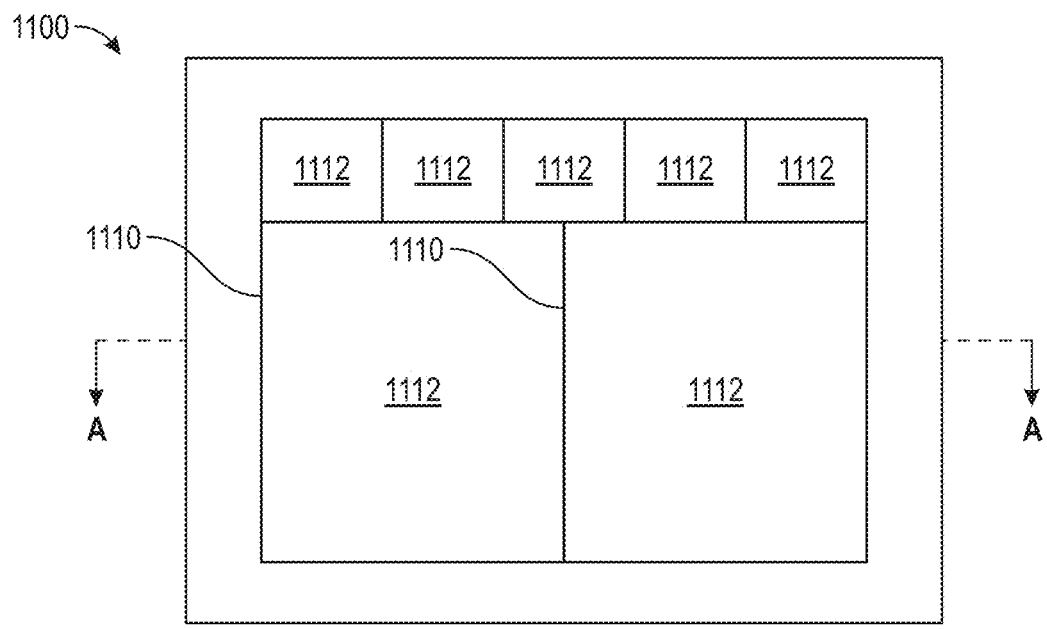
FIG. 11 depicts a top schematic view of a silicon wafer being prepared as a silicon chip carrier with integrated diodes, according to an exemplary embodiment.

FIG. 11 depicts a top schematic view of a semiconductor device structure 1100 that includes islands 1112 of semiconductor material, which are separated by trenches 1110. View line A-A depicts the location of the side sectional views shown in FIGS. 12, 13, 14, and 15. Note that the islands and trenches are uniquely used for dictating the size, and hence current, and in isolating each diode, respectively.

Figure 12:
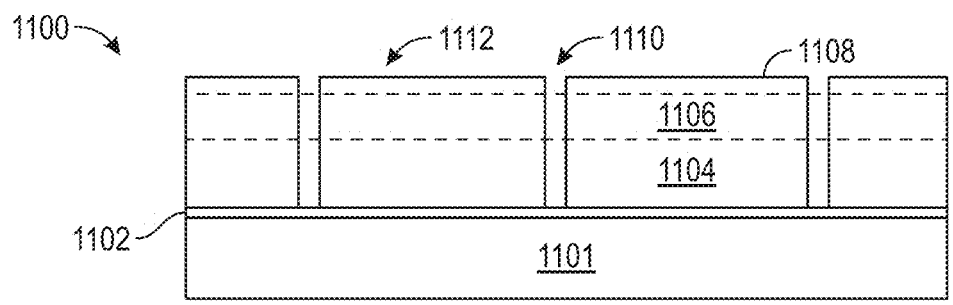
FIG. 12 through FIG. 15 depict side sectional schematic views of the silicon wafer of FIG. 11 after various steps of being prepared as a silicon chip carrier with integrated Schottky and P-I-N diodes, according to an exemplary embodiment.

FIG. 12 depicts a side sectional schematic view of the structure 1100 that includes a silicon-on-insulator substrate 1101. A barrier oxide (BOX) layer 1102 is formed on the substrate 1101. Layers of p+ doped epitaxial silicon (p+ epi-Si) 1104, intrinsic epitaxial silicon (I epi-Si) 1106, and n+ doped epitaxial silicon (n+ epi-Si) 1108 are formed on top of the BOX layer 1102. Trenches 1110 are etched down to the BOX layer 1102, separating islands 1112 to provide horizontal electrical isolation. In one or more embodiments, the etching of trenches 1110 is done by reaction isolation lithography, e.g., reactive ion etching. In one or more embodiments, the reactive ion etching uses a first Photolithography Mask.

Figure 13:
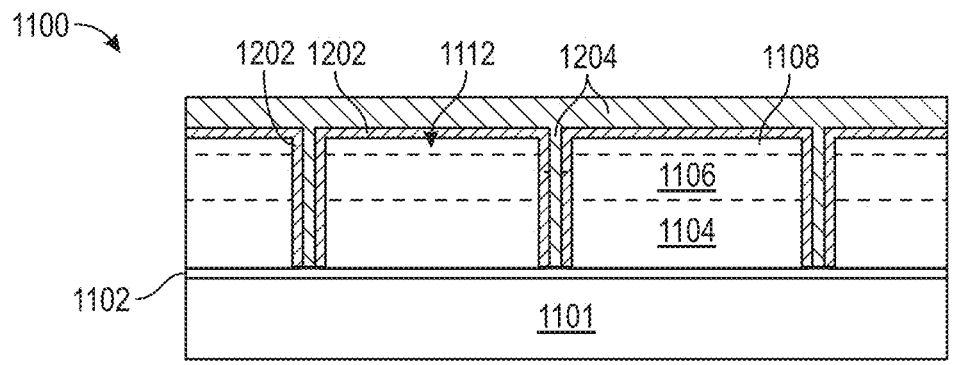

FIG. 13 depicts the structure 1100 following Thermal Oxide Growth, Low Temperature Oxide (LTO) Fill, and Chemical Mechanical Polishing (CMP) for Planarization. A thermal oxide layer 1202 is grown on the exposed surfaces of the islands 1112 in order to electrically isolate any silicon that was uncovered during the previous lithographic step that defined the vertical P-I-N silicon diode stack. Isolating the exposed silicon ensures that any subsequent metallization does not electrically short across any unintended silicon regions. Thermal oxide growth accomplishes a conformal isolation layer on any exposed silicon surface. After growing the thermal oxide layer 1202, a low temperature oxide (LTO) fill 1204 is deposited, e.g., by chemical vapor deposition (CVD). LTO fill 1204 increases the oxide isolation thickness, as well as pinching off any holes/vias that may still exist between the previously defined vertical P-I-N silicon diode stack, and minimizes the consumption of P-I-N silicon and/or the segregation of the silicon doping during subsequent steps. In one or more embodiments, any other deposited insulator (e.g., a nitride) may be used in addition to or in lieu of the LTO fill 1204. One additional benefit of the LTO fill 1204 may be to insure against over etching by incorporating an etchant stop layer such as nitride, guaranteeing a high etchant selectivity between the LTO and/or thermal oxide layer and the nitride layer. For example, when a scavenger for fluorine is added to fluorine-substituted hydrocarbon etch gases for an oxide layer over a nitride, a carbon-rich polymer is deposited onto the nitride which does not dissociate in the presence of oxygen. The result is almost infinite etch selectivity between the oxide and the nitride. The thickness of the LTO fill 1204 allows for chemical-mechanical polishing (CMP) planarization.

Figure 14:
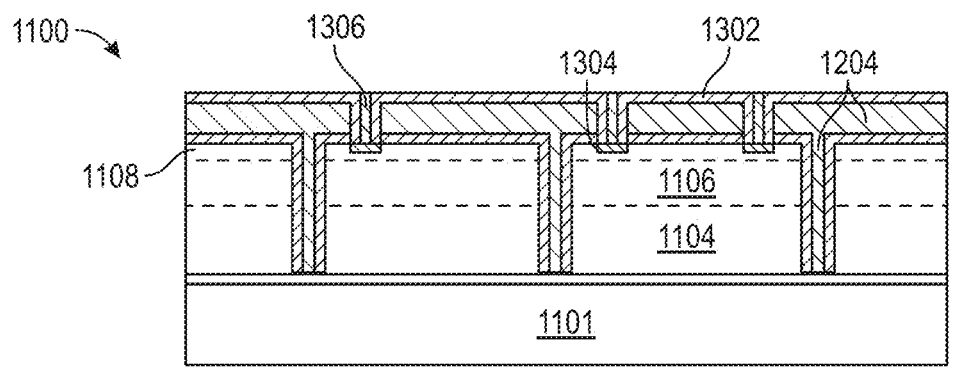

FIG. 14 depicts the structure 1100 following n+ Contact Lithography, n+ Contact reactive ion etching (RIE) stopping on n+ epi-Si, n+ Contact Silicide Formation, and n+ Copper Damascene Fill and Polish. First n+ contact lithography openings are formed followed by RIE (or other chemical etching, etc.) of the planarization insulator layer 1204 (Nitride, LTO, etc.) to form holes that stop on the n+ epi-Si 1108. The RIE etches both holes, those intended for the n+ contact, and those that are eventually continued in a second silicon etch for intended p+ contacts. The holes that see the first of two etches for intended p+ contacts are now masked and patterned with a second photoresist that overlaps the first still present n+ contact photoresist and the intended p+ contact hole. Next, a copper (Cu) metal barrier liner 1302 is deposited (e.g., a nitride such as TaN/Ta or SiCN) to prevent unwanted subsequent deposited Cu interdiffusion with underlying layers. A silicide formation 1304 is deposited into the bottoms of the holes with the intent to ensure good ohmic contact between the n+ silicon and the Cu layer. Then Cu contacts (cathodes) 1306 are filled and planarization is accomplished by the damascene process of Cu over depositing and subtractive polish back down to the liner 1302. A cleanup removal of any remaining photoresist in the intended p+ contact holes is performed.

Figure 15:
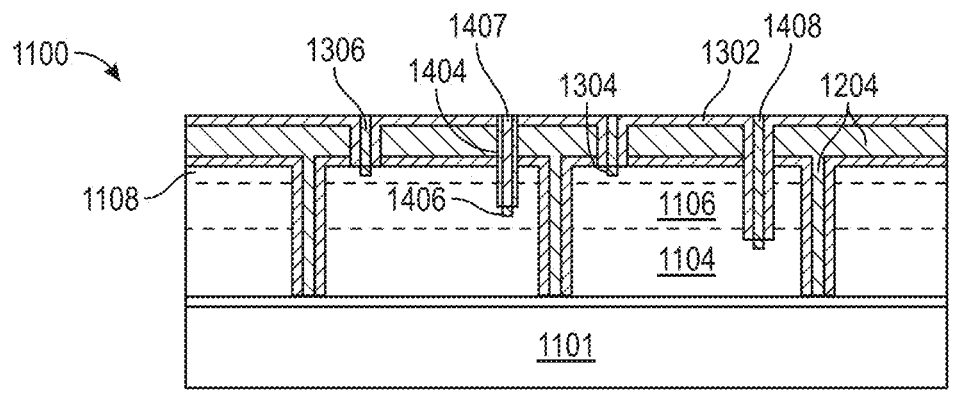

FIG. 15 depicts the structure 1100 following p+ Contact Lithography, p+ Contact RIE stopping in the p+ epi-Si, p+ Contact Sidewall Isolation, p+ Contact Silicide Formation, and p+ Copper Damascene Fill and Polish. The p+ Contact Lithography and RIE provide holes through the liner 1302 down to the boron doped silicon (p+ Epi-Si) layer 1104 of the P-I-N vertical stack diode (in the case of holes that were started during the n+ RIE) or just down to the intrinsic silicon (n− epi-Si) 1106 (in the case of holes that are started during the p+ RIE). To avoid unwanted contact/electrical shorting from the upper Cu layer to anything other than the p+ epi-Si, a sidewall isolation insulator film 1404 (oxide, nitride, etc.) is deposited along at least the areas of the n+ Epi-Si layer 1108 and the I Epi-Si layer 1106 that were exposed by the previous RIE. In the p+ Epi-Si layer 1104, a silicide formation 1406 is deposited with the intent to ensure good ohmic contact between the p+ silicon and the Cu layer. Cu contacts (anodes) 1407 (to the I epi-Si layer 1106) and 1408 (to the p+ epi-Si layer 1104) are filled and planarization is accomplished by the damascene process of Cu over depositing and subtractive polish back down to the liner 1302.

Note that in one or more embodiments, the steps of the P+ versus N+ Contact Lithography may be interchanged if there is no intended contact to be made to the I-epi-Si layer.

Figure 16:
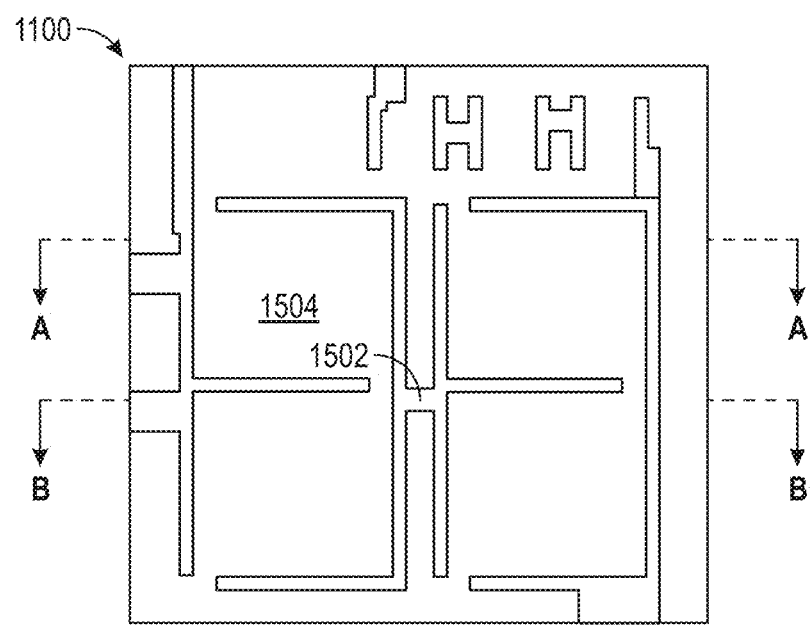
FIG. 16 depicts a top schematic view of the silicon wafer of FIG. 11 through FIG. 15 after interconnect fabrication.

FIG. 16 depicts a top schematic view of the structure 1100 following M1 Interconnect Lithography, M1 Interconnect RIE, M1 Copper Damascene Fill and Polish, and Low Temperature Oxide (LTO) Fill. View line B-B marks the location of the side sectional view shown in FIG. 17. View line A-A marks the locations of the side sectional views shown in FIG. 18 and in FIG. 19.

Figure 17:
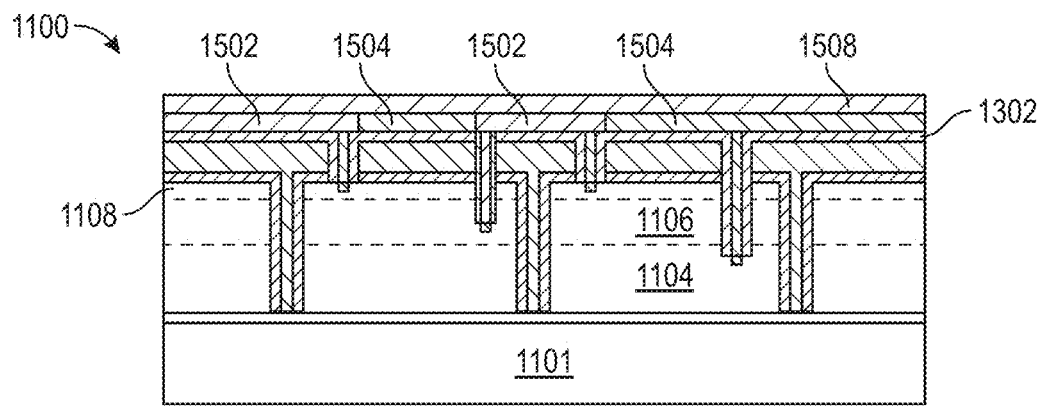
FIG. 17 through FIG. 19 depict side sectional views of the silicon wafer of FIG. 11 through FIG. 16 after further steps of being prepared as a silicon chip carrier with integrated Schottky and P-I-N diodes.

FIG. 17 depicts a side sectional schematic view of the structure 1100 following M1 Interconnect Lithography, M1 Interconnect RIE, M1 Copper Damascene Fill and Polish, and Low Temperature Oxide (LTO) Fill. The M1 (first level metal interconnects) lithography function provides first level metal electrical internal and external interconnects. With reference to both FIGS. 16 and 17, the internal interconnects 1502 connect the various n+ and p+ Cu contact metal fills to form the diode circuits with such external interconnects (shown in FIG. 27) as metal bonding and probing pads. At least for photosensitive diodes (further discussed below with reference to FIG. 21), the external interconnects are laterally displaced from the diode junctions to permit the junctions to be exposed to ambient light. First a low temperature insulator 1504, such as CVD SiOx, is deposited over the barrier layer liner 1302, either at atmospheric pressure (APCVD) or at low pressure (LPCVD) to a thickness of at least the intended thickness of the M1 Cu metal interconnect layer. Next the M1 Interconnect lithography openings are formed, followed by RIE (or other chemical etching, etc.) of the planarization insulator layer stopping on the underlying nitride layer 1302. Fill and planarization of the Cu interconnects 1502 is accomplished by the damascene process of Cu over depositing and subtractive polish back. Finally, low temperature nitride and oxide layers 1508 (compatible with the existing Cu) are deposited.

Figure 18:
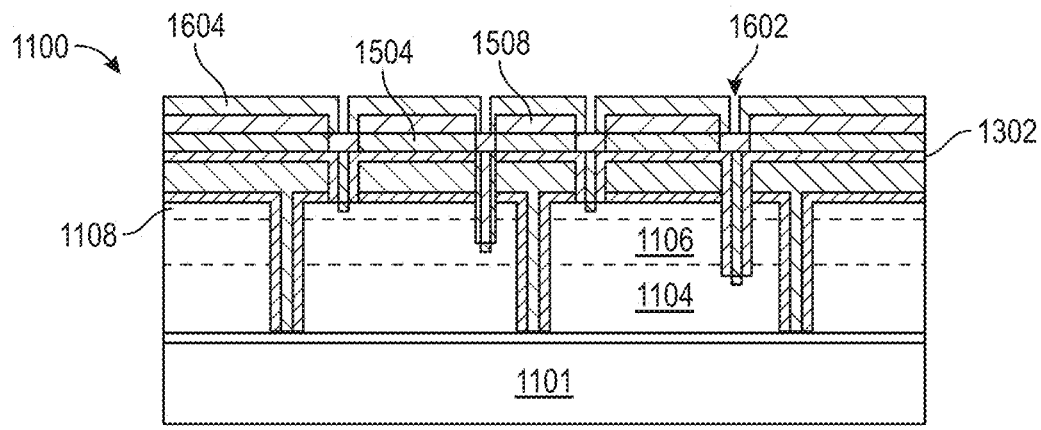

FIG. 18 depicts the structure following through-via (TV) Lithography, TV RIE, and TV Copper Seed Layer Deposition. The Through-Via (first level metal interconnects) Lithography function provides conductive (metal) through-vias 1602 usually for the purpose of contacting the conductive first level metal electrical interconnect (M1 metal). The TV lithography openings are formed, followed by RIE (or other chemical etching, etc.) of the deposited planarization insulator; the RIE selectively stops on the underlying M1 metal layer (or nitride layer if a blanket unconnected pad is to follow). Then a Ti/Cu/Ti seed layer 1604 is deposited.

Figure 19:
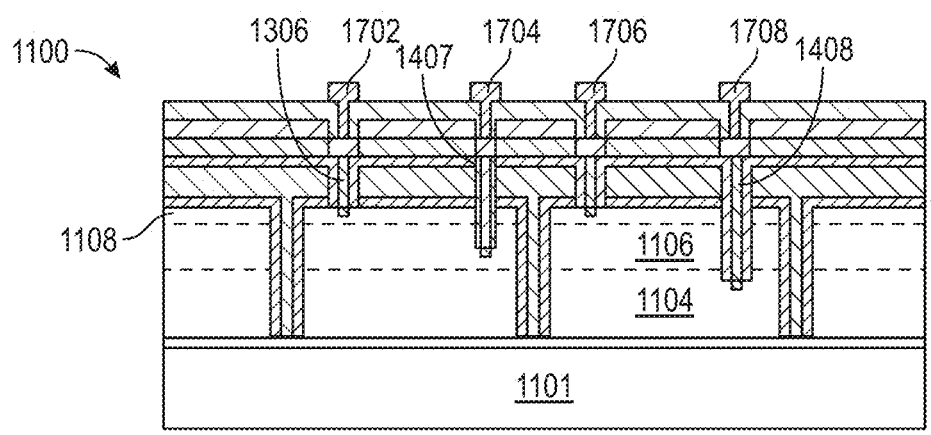

FIG. 19 depicts the structure following top metal (TM) Lithography and Nickel/Gold Post Electroplating. The n+ Contacts (cathodes) 1306 provide electrical connections to the n+ epi-Si (e.g., phosphorus doped silicon) layer 1108 of the P-I-N vertical stack diode. The n− Contacts (anodes) 1407 and the p+ Contacts (anodes) 1408 provide electrical connections to the I epi-Si layer 1106 and to the p+ Epi-Si (e.g., boron doped silicon) layer 1104 of the P-I-N vertical stack diode, respectively. The next level of metal (top metal TM) may be accomplished several ways. One way is to deposit a blanket (unpatterned) adhesion and seed layer of Ti/Cu/Ti followed by a photoresist layer (of thickness at least comparable to the desired Top Metal (TM) thickness) applied, exposed and developed. Top Metal contact fill (for example, nickel/gold) is plated onto the seed layer in the exposed openings in the photoresist, which are aligned with the cathodes 1306 and the anodes 1407 and 1408. Photoresist (PR) removal is followed by the exposed Ti/Cu/Ti seed layer etch to leave the TM contacts 1702, 1704, 1706, 1708 exposed.

Figure 20:
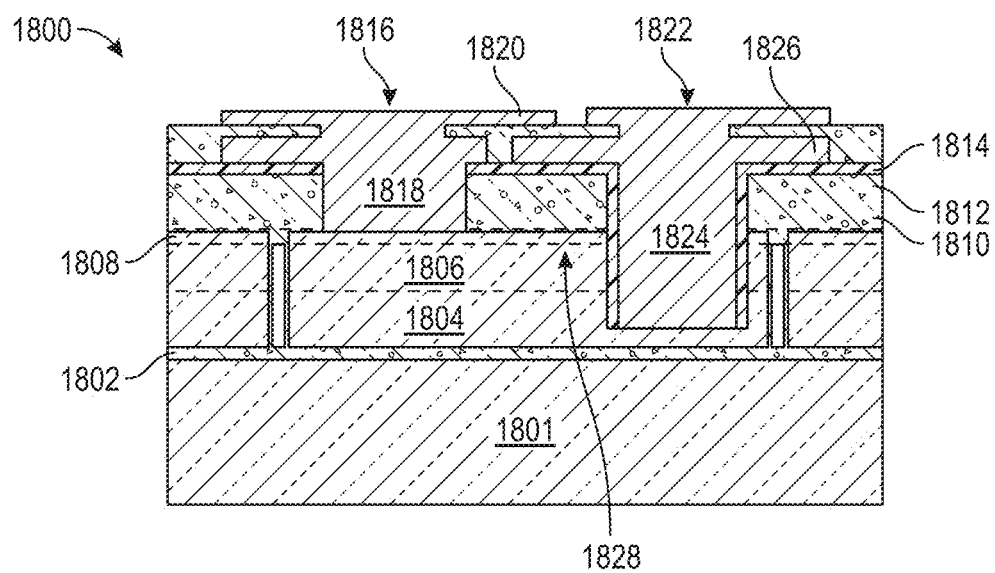
FIG. 20 depicts a side sectional view of a silicon chip carrier with an integrated shielded junction P-I-N diode, according to an exemplary embodiment.

FIG. 20 depicts a shielded P-I-N junction diode 1800 that is formed in a silicon chip carrier, with minimum photosensitivity for such uses as voltage regulation and overvoltage protection. The diode 1800 includes a silicon substrate 1801, a BOX layer 1802, a p+ epi-Si layer 1804, an I epi-Si layer 1806, and an n+ epi-Si layer 1808. In one or more embodiments, the p+ epi-Si layer 1804 is 2.0 µm thick, the I epi-Si layer 1806 is 1.8 µm thick, and the n+ epi-Si layer 1808 is 0.2 µm thick. The diode 1800 also includes a sacrificial LTO layer 1810 and a pinch-off LTO layer 1812, as well as a CVD $Si_3N_4$ layer 1814. The diode 1800 includes an n+ contact (cathode) 1816, which has a main plug 1818 and wings 1820. The diode 1800 also includes a p+ contact (anode) 1822, which has a main plug 1824 and wings 1826. In one or more embodiments, the main plugs 1818, 1824 are 5 µm in diameter with the n+ main plug 1818 being 2.6 µm deep (below the CVD $Si_3N_4$ layer 1814) and the p+ main plug being 5.8+/−0.5 µm deep. More generally, in one or more embodiments each of the N+, I, P+ layers range from 0.1 um to 20 um consistent with the design rules of FIG. 25. Since the I layer thickness is logarithmically proportional to the capture and conversion of photons into holes and electron, a thicker I layer will produce more current, for example, in the P-I-N diodes used as photovoltaic diodes. The N+ and P+ layer thickness can be optimized, where the lower thickness limit is dictated by the ability to serve as a good, low resistive ohmic contact for the cathode and anode metallization as well as satisfying the cathode and anode opening etch bias tolerance. At or slightly above the lower thickness, any added N+ and P+ thickness will add series resistance between the cathode and anode metal contact, and the I layer, and thereby will decrease photovoltaic P-I-N diode efficiency. The wings 1820, 1826 overlap to shadow the diode P-I-N junction 1828 between the main plugs 1818, 1824 so that the junction is exposed to minimal ambient light. As a result, the diode 1800 is not photosensitive.

Figure 21:
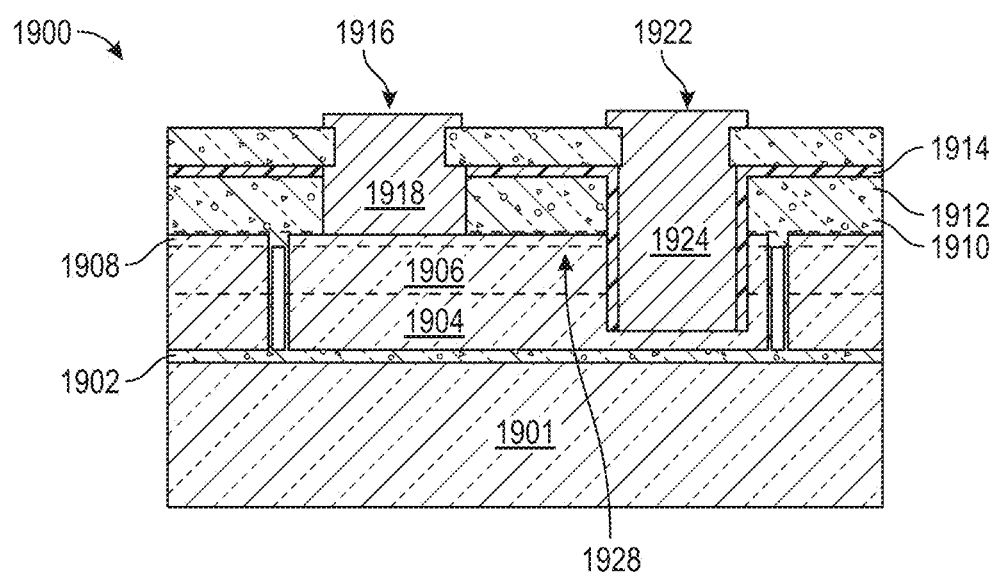
FIG. 21 depicts a side sectional view of a silicon chip carrier with an integrated shielded junction P-(metal)-N diode, according to an exemplary embodiment.

FIG. 21 depicts an unshielded P-I-N diode 1900 with photosensitivity, which can be utilized as a photodiode or as a photovoltaic cell. The diode 1900 includes a silicon substrate 1901, a BOX layer 1902, a p+ epi-Si layer 1904, an I epi-Si layer 1906, and an n+ epi-Si layer 1908. The diode 1900 also includes a sacrificial LTO layer 1910 and a pinch-off LTO layer 1912, as well as a CVD $Si_3N_4$ layer 1914. The diode 1900 includes an n+ contact (cathode) 1916, which has a main plug 1918. The diode 1900 also includes a p+ contact (anode) 1922, which has a main plug 1924. Between the main plugs 1918, 1924, metal over the diode P-I-N junction 1928 is reduced to maximize light collection. As a result, the diode 1900 is photosensitive.

In applications involving high frequency changes in light levels or optical communication, the photodiode uses the I epi-Si layer 1906 of intrinsic (undoped or lightly doped N−) semiconductor between the P and N layers to reduce the capacitance of the P-N junction and therefore improves the maximum switching speed. The comparatively deep intrinsic layer also provides a larger volume for photon to electron/hole conversion.

The P-I-N diode with photosensitivity can be also be utilized as photo-voltaic cells (PVs). Photovoltaic diodes have much larger area and corresponding junction capacitance than photodiodes in order to maximize the efficiency of light collection, but efficiency is not reduced from the larger junction capacitance as it is in the case of photodiodes since PVs are designed to produce (much greater) electric current at DC (0 Hz) and are not concern with capacitive effects on high frequency switching speed. Metal area over the active photovoltaic area (junction) is reduced to maximize photon collection and subsequent conversion to electron and hole carriers.

FIG. 22 depicts a shielded P-(metal)-N diode 1850 according to an exemplary embodiment. The diode 1850 includes a silicon substrate 1801, a BOX layer 1802, a p+ epi-Si layer 1804, an I epi-Si layer 1806, and an n+ epi-Si layer 1808. The diode 1850 also includes a sacrificial LTO layer 1810 and a pinch-off LTO layer 1812, as well as a CVD $Si_3N_4$ layer 1814. The diode 1850 includes a first n+ contact (cathode) 1852, formed in a first island of the stack, and includes a second n+ contact (first bridge contact) 1858, also formed in the first island of the stack. The n+ contacts terminate in the n+ epi-Si layer 1808. The cathode 1852 has a main plug 1854 and wings 1856, and the first bridge contact 1858 has a main plug 1860 and wings 1862. The diode 1850 also includes a first p+ contact (second bridge contact) 1864 that is formed in a second island of the stack, and includes a second p+ contact (anode) 1870, also formed in the second island of the stack. The p+ contacts terminate in the p+ epi-Si layer 1804. The second bridge contact 1864 has a main plug 1866 and wings 1868, and the anode 1870 has a main plug 1872 and wings 1874. The diode 1850 also includes a via bar (bridge) 1876, which electrically connects the first and second bridge contacts 1858, 1864 to short across the intrinsic silicon layer 1806 between the two islands of the stack. The bridge 1876 and the contacts 1858, 1864 thereby form an unexpected junction between the n+ epi-Si layer of the first island and the p+ epi-Si layer of the second island. Thus, the diode 1850 is effectively a P-(metal)-N diode that has characteristics of a conventional P-N diode while being formed on two P-I-N stacks. Advantageously, the P-(metal)-N diode 1850 can be formed during the same fabrication steps and in the same layers as a conventional P-I-N diode.

FIG. 23 depicts an unshielded P-(metal)-N junction diode 1950 with photosensitivity, according to an exemplary embodiment, which can be utilized as a photodiode or as a photovoltaic cell. The diode 1950 includes a silicon substrate 1901, a BOX layer 1902, a p+ epi-Si layer 1904, an I epi-Si layer 1906, and an n+ epi-Si layer 1908. The diode 1950 also includes a sacrificial LTO layer 1910 and a pinch-off LTO layer 1912, as well as a CVD $Si_3N_4$ layer 1914. The diode 1950 includes a first n+ contact (cathode) 1952 which is formed in a first island of the stack, and also includes a second n+ contact (first bridge contact) 1958, which also is formed in the first island. The cathode 1952 has a main plug 1954 and the first bridge contact 1958 has a main plug 1960. The diode 1950 also includes a first p+ contact (second bridge contact) 1964, which is formed in a second island of the stack, and includes a second p+ contact (anode) 1970, which also is formed in the second island. The second bridge contact 1964 has a main plug 1966 and the anode 1970 has a main plug 1972. The diode 1950 also includes a via bar (bridge) 1976, which electrically connects the first and second bridge contacts 1958, 1964 to short across the intrinsic silicon layer 1906 between the two islands of the stack and form a metal junction between the n+ epi-Si layer of the first stack and the p+ epi-Si layer of the second stack. Thus, the diode 1950 is effectively a P-(metal)-N diode that has characteristics of a conventional P-N diode while being formed on two P-I-N stacks. Advantageously, the P-(metal)-N diode 1950 can be formed with the same fabrication steps and in the same layers as a conventional P-I-N diode. Because the diode 1950 does not have wings that cover the junctions of the diode, the diode 1950 is photosensitive.

The previous PIN photosensitive diode 1900, described with reference to FIG. 21, was a "vertical" photosensitive diode, where the depletion width was controlled by the thickness of the intrinsic layer; the larger the I-layer thickness, the more efficient conversion of incoming photons to electron-hole pairs.

In contrast, the P-(metal)-N photosensitive diode 1950, described with reference to FIG. 23, is a "lateral" photosensitive diode (if no metal shielding). The efficiency is now controlled by the horizontal separation between the metal bridge and the external n+ and p+ contacts. The horizontal separation between the bridge metal and the p+ or n+ external contacts is where the electric field drop is and the resulting depletion layer formed. The depletion region dimensions are well controlled by the metal contacts layout and can be varied by the designer. The larger the gap the higher the efficiency.

Another way to look at this is as an n-M-p diode, where the M is metal or the shorting metal bridge. Since the metal is highly conductive (compared to the n+ and p+ region), there is no voltage drop across the metal and the metal acts as shorting the n+ to p+ layers directly. The voltage drop is forced to appear across the n+-p+ dimension between the n+ and p+ metal contact. The gradient of this voltage drop is controlled by the lateral n+ and p+ dimension between any metal contacts.

Figure 24:
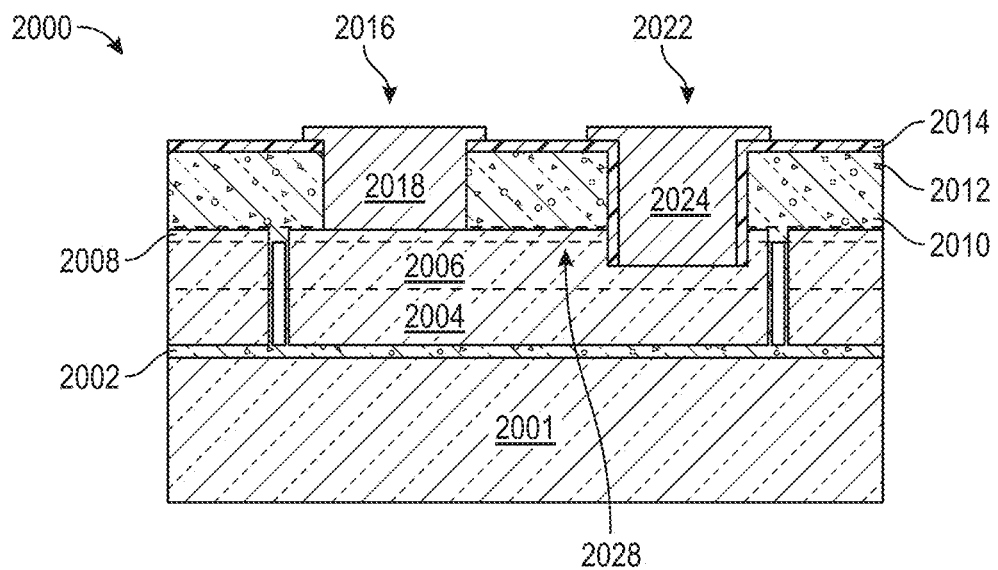
FIG. 24 depicts a side sectional view of a silicon chip carrier with an integrated Schottky diode, according to an exemplary embodiment.

FIG. 24 depicts a Schottky diode 2000, also called a Hot Carrier Diode or Schottky Barrier Diode, which uses a metal/semiconductor junction 2028 instead of a P semiconductor/N semiconductor junction. The Schottky diode 2000 has a substrate 2001 on which a buried oxide (BOX) layer 2002 is deposited. A p+ epi-Si layer 2004, an n−/intrinsic epi-Si layer 2006, and an n+ epi-Si layer 2008 are laid down on top of the BOX layer 2002. The Schottky diode 2000 also includes a sacrificial LTO layer 2010 and a pinch-off LTO layer 2012, as well as a CVD $Si_3N_4$ layer 2014. The Schottky diode 2000 has a metal cathode contact 2016 with a main plug 2018 that ends in the heavily doped n+ epi-Si layer 2008 and has a metal anode contact 2022 with a main plug 2024 that ends in the intrinsic metal or lightly doped N− silicon region 2006. The metal anode 2022 uses gold, silver, platinum, tungsten, molybdenum, chromium, etc. A low junction potential between the metal and the adjoining silicon, about 0.15V to 0.3V, makes the Schottky diode 2000 very suitable for RF applications in mixers, modulator and demodulator stages as well as power regulators. The diode has a very fast reverse recovery time since there are no minority carriers, lending to high frequency operation (Gigahertz to Terahertz). Note that Intrinsic silicon has a very low level of dopant, thus for all practical purposes, it can be N−. Advantageously, in one or more embodiments the Schottky diode 2000 can be fabricated in the same layers and during the same processing steps as the P-I-N diodes 1800, 1900 and the P-N diodes 1850, 1950.

Figure 27:
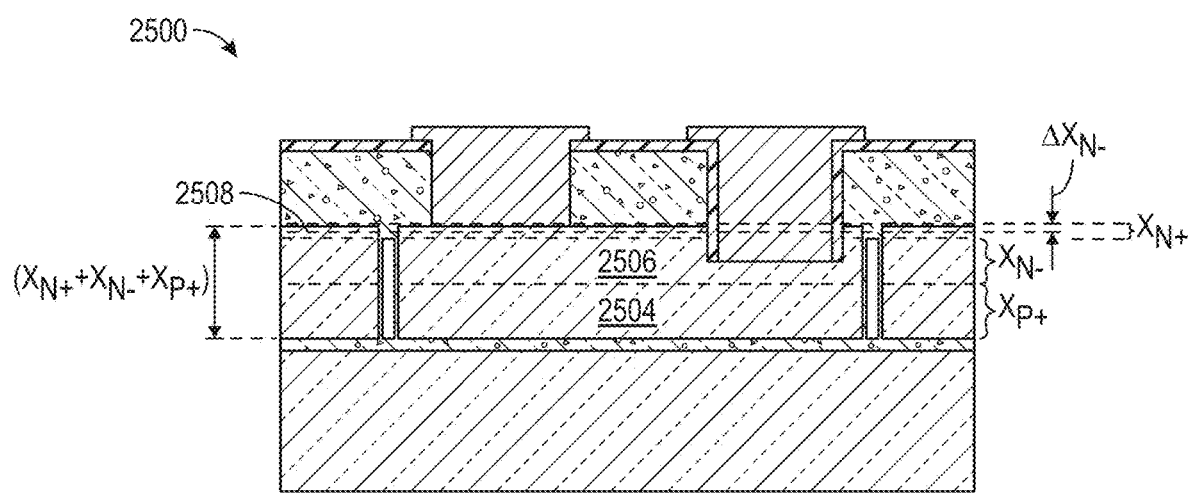
FIG. 27 depicts a side sectional view of the silicon chip carrier of FIG. 11 through FIG. 19, annotated with dimensions referenced in FIG. 25 and FIG. 26.

Considering a fabrication process in which all of the cathode and anode holes are etched in only two steps, FIG. 25 depicts a table for calculating etch depths of the cathodes 1816, 1852, 1858, 1916, 1952, 1958, 2004 and of the anodes 1822, 1864, 1870, 1922, 1964, 1970, 2022. FIG. 26 depicts formulas constraining the etch depths. FIG. 27 is an explanatory figure, which depicts a silicon chip carrier 2500 with n+ epi-Si layer 2508, n− epi-Si layer 2506, and p+ epi-Si layer 2504, as well as the layer and etch dimensions $x_{n+}$, $x_{n-}$, $\Delta x_{n+}$, $x_{p+}$ that are shown in FIG. 25 and FIG. 26. Referring back to FIG. 20 through FIG. 23, note that holes for the cathodes 1816, 1852, 1858, 1916, 1952, 1958, 2004 are etched only to the n+ epi-Si layers 1808, 1908, 2008 during a (n+ epi-Si) RIE step. The hole for the Schottky diode anode 2022 is etched only into the I epi-Si layer 2006 during a (p+ epi-Si) RIE step. The holes for the anodes 1822, 1864, 1870, 1922, 1964, 1970 are etched down all the way into the p+ epi-Si layers 1804, 1904 during both the (n+ epi-Si) and the (p+ epi-Si) RIE steps. During steps when particular holes are not to be etched, those holes are covered with photoresist. Metal fill can be done over the photoresist following the n+ etch step (filling only the cathodes) then following photoresist removal and p+ etch step (filling the anodes), or can be done after all etching is completed (filling both cathodes and anodes in a single step).

Figure 28:
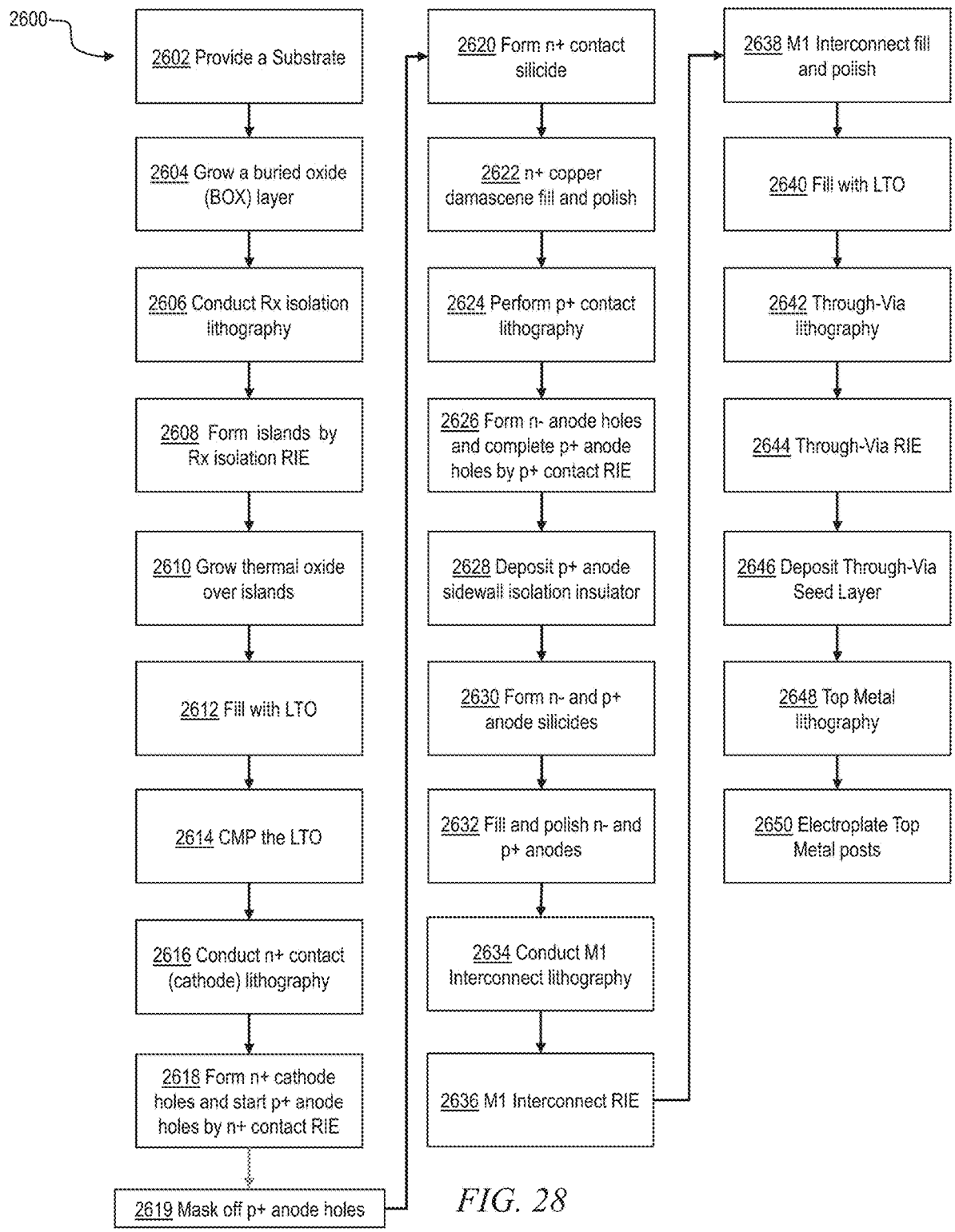
FIG. 28 depicts in a flowchart steps of a method for preparing a silicon chip carrier consistent with FIG. 11 through FIG. 19.
Figure 29:
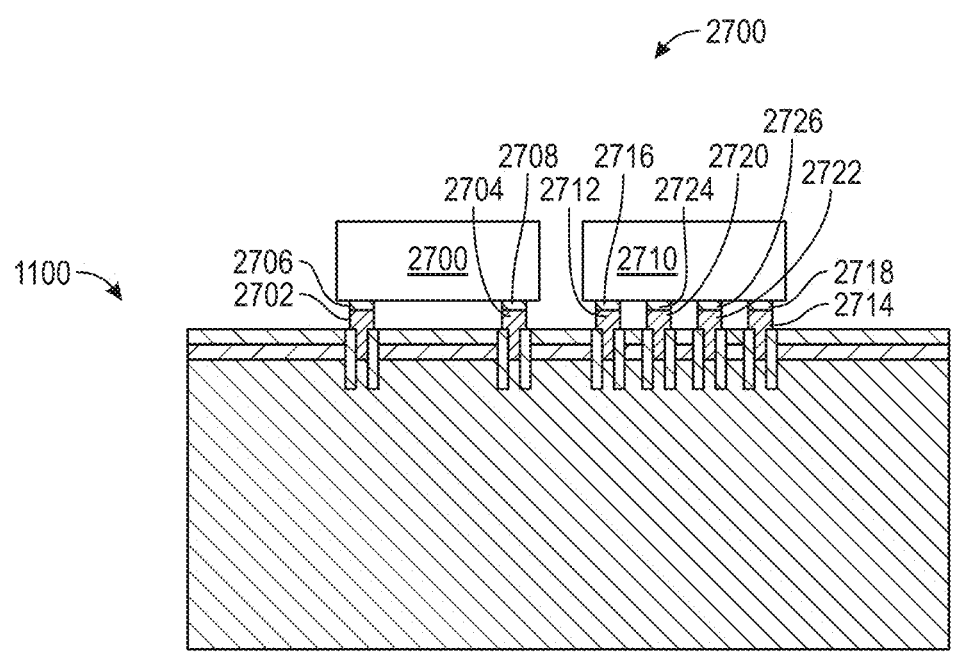
FIG. 29 depicts an apparatus with integrated circuit chips assembled on to the silicon chip carrier of FIG. 11 through FIG. 19.

FIG. 28 depicts in a flowchart the exemplary method 2600 for manufacture of a silicon chip carrier as discussed above with reference to FIG. 11 through FIG. 23.

At 2602, provide a Substrate, e.g., a silicon-on-insulator (SOI) substrate such as the substrate 1101 shown in FIG. 12. Bulk or epitaxial silicon ("epi-Si") equally could be used with the BOX layer to provide isolation between the islands. At 2604, grow a buried oxide (BOX) layer, p+ epi-Si, I epi-Si, and n+ Epi-Si layers in that order on the substrate, e.g., layers 1102, 1104, 1106, 1108 as shown in FIG. 12. At 2606, conduct active area (Rx) Isolation Lithography on at least the n+ epi-Si layer. At 2608, form trenches (e.g., 1110 in FIG. 12) by performing Rx Isolation RIE stopping on the BOX layer.

At 2610, grow a Thermal Oxide layer (e.g., 1202 in FIG. 13) over the n+ epi-Si layer. At 2612, fill with Low Temperature Oxide (LTO), e.g., 1204 in FIG. 13. At 2614, Oxide Polish (CMP) the LTO for Planarization.

At 2616, conduct n+ Contact Lithography that removes the LTO and any overlying nitride (e.g., $Si_3N_4$) that cover the locations of n+ contact (cathode) holes or p+ contact (anode) holes to be formed. At 2618, form the cathode holes and start p+ contact (anode) holes by n+ Contact RIE stopping on the n+ epi-Si layer. At 2619, mask the p+ anode holes. At 2620, form n+ Contact Silicide at the bottoms of the cathode holes. At 2622, perform n+ Copper Damascene Fill and Polish to form n+ Contacts, e.g., 1306 as shown in FIG. 14.

At 2624, perform p+ Contact Lithography that removes the LTO and any overlying nitride (e.g., $Si_3N_4$) that covers the locations of n− contact (anode) holes to be formed. At 2626, form p+ anode holes and n− anode holes by conducting p+ Contact RIE that stops in the p+ epi-Si (for holes started during the previous n+ Contact RIE, at 2618) or in the n− epi-Si (for holes started during the p+ Contact RIE). At 2628, perform p+ Contact Sidewall Isolation by depositing a sidewall isolation insulator film (oxide, nitride, etc.). At 2630, form the p+ Contact Silicide. At 2632, conduct p+ Copper Damascene Fill and Polish to form n− Contacts and p+ Contacts, e.g., 1407 and 1408 as shown in FIG. 15.

At 2634, conduct M1 Interconnect Lithography. At 2636, perform M1 Interconnect RIE. At 2638, fill and polish the M1 interconnects (e.g., 1502 as shown in FIG. 17) by Copper damascene fill and polish process. At 2640, fill with Low Temperature Oxide (LTO), e.g., 1508 as shown in FIG. 17.

At 2642, perform through-via (TV) Lithography to form vias, e.g., 1602 as shown in FIG. 18. At 2644, conduct TV RIE. At 2646, deposit a TV Copper Seed Layer, e.g., 1604 as shown in FIG. 18.

Note that, although copper is discussed as a fill metal suitable for one or more embodiments, this is a non-limiting example. Other metal (e.g., a noble metal such as gold, silver, palladium, ruthenium) can be used in one or more embodiments.

At 2648, conduct top metal (TM) Lithography. At 2650, electroplate the Nickel/Gold Post top metal, e.g., 1708 as shown in FIG. 19.

FIG. 27 depicts in a side view schematic a first integrated circuit chip 2700 mounted onto the silicon chip carrier structure 1100 at external interconnects 2702, 2704. In one or more embodiments, a power voltage terminal 2706 of the first integrated circuit chip 2700 is connected by external interconnect 2702 to the power output terminal V3 of the exemplary diode circuit 100 (shown in FIG. 1) that is integrally formed in the silicon chip carrier structure 1100, while a ground terminal 2708 of the first integrated circuit chip 2700 is connected by external interconnect 2704 to the ground rail GND of the exemplary diode circuit 100.

Also shown in FIG. 27 is a second integrated circuit chip 2710 that is mounted onto the silicon chip carrier structure 1100 at external interconnects 2712, 2714, 2720 and 2722 In one or more embodiments, a power voltage terminal 2716 of the second integrated circuit chip 2710 is connected by external interconnect 2712 to the power output terminal V1 of the exemplary diode circuit 100 that is integrally formed in the silicon chip carrier structure 1100, while a ground terminal 2718 of the second integrated circuit chip 2710 is connected by external interconnect 2714 to the ground rail GND of the exemplary diode circuit 100. Thus, the first and second external interconnects 2702, 2704 are adapted to deliver power to the first integrated circuit chip 2700 and the third and fourth external interconnects 2712, 2714 are adapted to deliver power to the second integrated circuit chip 2710. In addition to power and GND, there may be additional signal terminals, such as LEDout terminal 2724 and PDout terminal 2726 that, for example, amplitude modulate the outgoing optical communication or the incoming optical communication, respectively.

Given the discussion thus far, it will be appreciated that, in general terms, an exemplary apparatus, according to an aspect of the invention, includes a silicon chip carrier; a first P-I-N diode 1800 that is integrally formed in the silicon chip carrier, wherein the first P-I-N diode includes a first anode 1822 and a first cathode 1816 that define a first P-I-N junction 1828, the first anode and first cathode being shaped so that the first P-I-N junction is covered by wings 1826 of the first anode and by wings 1820 of the first cathode and the first P-I-N diode is not photosensitive; and a second P-I-N diode 1900 that is integrally formed in the silicon chip carrier, wherein the second P-I-N diode includes a second anode 1924 and a second cathode 1918 that define a second P-I-N junction 1928, the second anode and second cathode being shaped so that the second P-I-N junction is uncovered and the second P-I-N diode is photosensitive.

In another aspect, a silicon chip carrier includes a p+ epi-Si layer 1804, an intrinsic epi-Si layer 1806 directly contacting the p+ epi-Si layer, and an n+ epi-Si layer 1808 directly contacting the intrinsic epi-Si layer opposite the p+ epi-Si layer; and a first P-(metal)-N diode 1850 that is integrally formed in the p+ epi-Si, intrinsic epi-Si, and n+ epi-Si layers of the silicon chip carrier.

In another aspect, a method 2600 for making a silicon chip carrier with integrated diode circuits includes at 2608 forming islands in a layered structure that includes a p+ epi-Si layer, an n− or intrinsic epi-Si layer deposited in direct electrical contact with the p+ epi-Si layer, and an n+ epi-Si layer deposited in direct electrical contact with the n− or intrinsic epi-Si layer. The method also includes at 2610 growing a thermal oxide on exposed surfaces of the islands; at 2618, etching a first cathode hole and a first anode hole down through the thermal oxide into the n+ epi-Si layer in a first island and etching a second cathode hole into the n+ epi-Si layer in a second island; at 2622 forming cathode contacts by filling the cathode holes with a fill metal; at 2626, etching the first anode hole down through the n− or intrinsic epi-Si layer to the p+ epi-Si layer in the first island and etching a second anode hole down through the thermal oxide into the n− or intrinsic epi-Si layer in the second island; and at 2632 forming anode contacts by filling the first and second anode holes with the fill metal, wherein in the first island the first cathode contact extends into the n+ epi-Si layer and the first anode contact extends into the p+ epi-Si layer, forming a P-I-N diode, while in the second island the second cathode contact extends into the n+ epi-Si layer and the second anode contact extends into the n− or intrinsic epi-Si layer, forming a Schottky diode.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a silicon chip carrier;
a first P-I-N diode that is integrally formed in the silicon chip carrier, wherein the first P-I-N diode includes a first anode and a first cathode that define a first P-I-N junction, the first anode having first anode wings, the first cathode having first cathode wings, the first anode and first cathode being shaped so that the first P-I-N junction is covered by the wings of the first anode and by the wings of the first cathode and the first P-I-N diode is not photosensitive; and
a second P-I-N diode that is integrally formed in the silicon chip carrier, wherein the second P-I-N diode includes a second anode and a second cathode that define a second P-I-N junction, the second anode and second cathode being shaped so that the second P-I-N junction is uncovered and the second P-I-N diode is photosensitive.

2. The apparatus of claim 1, wherein each of the first and second P-I-N diodes has a higher voltage node and a lower voltage node, further comprising:
a power rail electrically connected to the higher voltage nodes of the first and second P-I-N diodes; and
a ground rail electrically connected to the lower voltage nodes of the first and second P-I-N diodes, wherein the first P-I-N diode regulates the voltage of the power rail relative to the ground rail, while the second P-I-N diode establishes a voltage on the power rail that is higher than the voltage of the ground rail.

3. The apparatus of claim 1, further comprising another photosensitive diode and another non-photosensitive diode, wherein the first P-I-N diode and the another non-photosensitive diode form a first plurality of non-photosensitive P-I-N diodes that are connected in series to provide a higher voltage end and a lower voltage end, wherein the second P-I-N diode and the another photosensitive diode form a second plurality of photosensitive diodes that are connected in series to provide a higher voltage end and a lower voltage end, further comprising:
a power rail connected across the higher voltage ends of the first and second pluralities of P-I-N diodes;
a ground rail connected across the lower voltage ends of the first and second pluralities of P-I-N diodes; and
at least one power output terminal electrically connected between the first diode and another diode of the first plurality of non-photosensitive P-I-N diodes,
wherein the second plurality of photosensitive P-I-N diodes are connected from the power rail to the ground rail in parallel to the first plurality of non-photosensitive P-I-N diodes, the second plurality of photosensitive P-I-N diodes deliver a voltage to the power rail that is higher than a voltage of the ground rail, and the first plurality of non-photosensitive P-I-N diodes regulate the voltage of the power output terminal relative to the ground rail.

4. The apparatus of claim 3, further comprising:
a third P-I-N diode that is integrally formed in the silicon chip carrier, wherein the third P-I-N diode has a third P-I-N junction that is covered so that the third P-I-N diode is not photosensitive, and the third P-I-N diode has a higher voltage end connected to the power rail and has a lower voltage end; and
an energy storage device that is connected between the lower voltage end of the third P-I-N diode and the ground rail in parallel to the first and second pluralities of P-I-N diodes, wherein the third P-I-N diode limits a charging voltage of the energy storage device.

5. The apparatus of claim 4, wherein the energy storage device is selected from the list consisting of: a battery or a capacitor.

6. The apparatus of claim 5, wherein the energy storage device is a capacitor and is formed integrally in the silicon chip carrier.

7. The apparatus of claim 4, further comprising:
a first electrical contact protruding through a surface of the silicon chip carrier directly from the cathode of the first P-I-N diode,
wherein the first electrical contact delivers a first output voltage that is intermediate between the voltage of the power rail and the voltage of the ground rail.

8. The apparatus of claim 7, further comprising:
a second electrical contact protruding through a surface of the silicon chip carrier from an interconnect between an anode of the first non-photosensitive P-I-N diode and a cathode of the other non-photosensitive P-I-N diode,
wherein the second electrical contact delivers a second output voltage that is intermediate between the first output voltage and the voltage of the ground rail.

9. The apparatus of claim 8, further comprising a first integrated circuit chip that is mounted to the surface of the silicon chip carrier and electrically connected between the first electrical contact and the ground rail, wherein the first electrical contact is delivers power to the first integrated circuit chip.

10. The apparatus of claim 9, further comprising a second integrated circuit chip that is mounted to the surface of the silicon chip carrier and electrically connected between the second electrical contact and the ground rail, wherein the second electrical contact delivers power to the second integrated circuit chip.

* * * * *